US012635214B2

(12) United States Patent
Kobayashi et al.

(10) Patent No.: US 12,635,214 B2
(45) Date of Patent: May 19, 2026

(54) SEMICONDUCTOR DEVICE AND METHOD OF MANUFACTURING THE SAME

(71) Applicant: FUJI ELECTRIC CO., LTD., Kawasaki (JP)

(72) Inventors: Keisuke Kobayashi, Matsumoto-city (JP); Makoto Endou, Matsumoto-City (JP); Shiomi Inoue, Sapporo-City (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 489 days.

(21) Appl. No.: 18/358,606

(22) Filed: Jul. 25, 2023

(65) Prior Publication Data

US 2024/0072132 A1 Feb. 29, 2024

(30) Foreign Application Priority Data

Aug. 26, 2022 (JP) ................................. 2022-134908

(51) Int. Cl.
| | |
|---|---|
| H10D 64/23 | (2025.01) |
| H10D 12/00 | (2025.01) |
| H10D 12/01 | (2025.01) |
| H10D 84/60 | (2025.01) |

(52) U.S. Cl.
CPC ......... H10D 64/231 (2025.01); H10D 12/035 (2025.01); H10D 12/038 (2025.01); H10D 12/481 (2025.01); H10D 84/617 (2025.01)

(58) Field of Classification Search
CPC ......... H10D 12/411–491; H10D 12/00; H10D 12/038; H10D 12/481; H10D 64/232; H10D 62/142; H10D 62/145; H10D 62/393
See application file for complete search history.

(56) References Cited

U.S. PATENT DOCUMENTS

| | | | |
|---|---|---|---|
| 10,847,640 B2 | 11/2020 | Naito | |
| 11,177,357 B2 | 11/2021 | Aida et al. | |
| 11,552,185 B2 | 1/2023 | Naito | |
| 2018/0350961 A1 | 12/2018 | Naito | |
| 2020/0388671 A1* | 12/2020 | Takemoto | ............ H10D 62/107 |
| 2021/0074836 A1 | 3/2021 | Naito | |
| 2021/0226017 A1* | 7/2021 | Kubouchi | ............ H10D 62/127 |

(Continued)

FOREIGN PATENT DOCUMENTS

| | | |
|---|---|---|
| JP | 2003-298055 A | 10/2003 |
| JP | 2009-043966 A | 2/2009 |

(Continued)

*Primary Examiner* — Wasiul Haider

(57) ABSTRACT

A semiconductor device includes: an insulated gate electrode structure provided in a semiconductor substrate; a base region; a first main electrode region; a contact plug buried in a trench penetrating the first main electrode region to reach the base region with a barrier metal film interposed; an interlayer insulating film provided with a contact hole integrally connected to the trench; a contact region provided in contact with a bottom of the trench; and a second main electrode region, wherein an opening width at a lower end of the contact hole conforms to a width at an opening of the trench, an upper part of a side wall continued from the opening of the trench has a curved surface convex to an outside, and a lower part of the side wall continuously connected to the bottom of the trench has a curved surface convex to the outside.

15 Claims, 20 Drawing Sheets

(56)  References Cited

U.S. PATENT DOCUMENTS

| | | |
|---|---|---|
| 2021/0296456 A1 | 9/2021 | Aida et al. |
| 2023/0142388 A1 | 5/2023 | Naito |

FOREIGN PATENT DOCUMENTS

| | | |
|---|---|---|
| JP | 2019-134149 A | 8/2019 |
| JP | 6702423 B2 | 6/2020 |
| JP | 2021-150375 A | 9/2021 |

* cited by examiner

SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Application No. 2022-134908 filed on Aug. 26, 2022, the entire contents of which are incorporated by reference herein.

BACKGROUND OF THE INVENTION

1. Field of the Invention

The present invention relates to a semiconductor device and a method of manufacturing the same.

2. Description of the Related Art

Development of technique that compensates a decrease in tolerance in association with minimization of semiconductor devices such as an insulated gate bipolar transistor (IGBT) having a trench-gate structure have grown recently, which subjects an interlayer insulating film to etching to form a contact hole on which a mesa part between gate trenches is exposed, and further subjects the mesa part between the gate trenches to etching so as to form a trench (contact trench).

Such a contact trench is formed by anisotropy etching of reactive ion etching (RIE). Since this etching leads side walls of the contact trench to be flat and have a tapered shape, and also leads a bottom of the contact trench to be flat, the connected parts defined by the side walls and the bottom thus have an angular shape. After the contact trench is formed, p-type impurity ions such as boron (B) are implanted into the bottom of the contact trench to form a contact region having a high impurity concentration so as to decrease a contact resistance. The contact trench is then filled with a contact plug made from tungsten (W), for example, via a barrier metal film made from titanium (Ti), titanium nitride (TiN), or the like.

JP 2019-134149 A discloses a semiconductor device having a trench contact structure, in which a trench has a greater width under the middle of a source region of n$^+$-type, and a contact region of p$^+$-type is provided on a surface exposed to a part at which the width is increased. JP 6702423 B2 discloses a semiconductor device having a bow-shaped gate trench.

JP 2003-298055 A discloses forming a trench by isotropic etching. JP 2009-43966A discloses forming a sacrificial film made of silicon nitride (SiN) in a trench. JP 2021-150375 A discloses forming a reverse tapered trench.

As described above, since the contact trench has the tapered shape, the p-type impurity ions are implanted not only into the bottom of the contact trench, which is the intended part, but also into the side walls. When a distance between the contact trench and the gate trench is decreased in association with the minimization of the semiconductor device, a gate threshold voltage changes due to the implantation of the p-type impurity ions into the side walls of the contact trench. Since the changed amount of the gate threshold voltage varies depending on a difference in shape of the contact trench on the plane of the wafer or between the wafers, the semiconductor device with such a configuration has a problem of an increase in variation of the gate threshold voltage.

Further, since the connected parts defined by the side walls and the bottom of the contact trench has the angular shape, the barrier metal film when formed could be cut off at the angular parts when an aspect ratio of the contact trench is increased in association with the minimization, and the barrier metal film could be separated starting from the cut-off parts.

SUMMARY OF THE INVENTION

In view of the foregoing problems, the present invention provides a semiconductor device having a configuration capable of avoiding or decreasing a variation in gate threshold voltage derived from implantation of impurity ions into a contact trench and preventing separation of a barrier metal film in the contact trench, and also provides a method of manufacturing the same.

An aspect of the present invention inheres in a semiconductor device including: an insulated gate electrode structure provided in a semiconductor substrate of a first conductivity-type; a base region of a second conductivity-type provided in contact with the insulated gate electrode structure at an upper part of the semiconductor substrate; a first main electrode region of the first conductivity-type provided in contact with the insulated gate electrode structure at an upper part of the base region; a contact plug buried in a trench penetrating the first main electrode region to reach the base region with a barrier metal film interposed; an interlayer insulating film deposited on a top surface of the semiconductor substrate and provided with a contact hole integrally connected to the trench; a contact region of the second conductivity-type provided in contact with a bottom of the trench; and a second main electrode region deposited on a bottom surface side of the semiconductor substrate, wherein an opening width at a lower end of the contact hole conforms to a width at an opening of the trench, an upper part of a side wall continued from the opening of the trench has a curved surface convex to an outside, and a lower part of the side wall continuously connected to the bottom of the trench has a curved surface convex to the outside.

Another aspect of the present invention inheres in a method of manufacturing a semiconductor device including: forming an insulated gate electrode structure in a semiconductor substrate of a first conductivity-type; forming a base region of a second conductivity-type so as to be in contact with the insulated gate electrode structure at an upper part of the semiconductor substrate; forming a first main electrode region of the first conductivity-type so as to be in contact with the insulated gate electrode structure at an upper part of the base region; forming an interlayer insulating film on a top surface of the semiconductor substrate; opening a contact hole in the interlayer insulating film; forming a trench at the upper part of the semiconductor substrate so as to be integrally connected to the contact hole and penetrating the first main electrode region to reach the base region; forming a contact region of the second conductivity-type so as to be in contact with a bottom of the trench by implanting impurity ions of the second conductivity-type into the bottom of the trench; burying a contact plug in the trench with a barrier metal film interposed; and forming a second main electrode region on a bottom surface side of the semiconductor substrate, the forming the trench is executed so as to have a structure in which an opening width at a lower end of the contact hole conforms to a width at an opening of the trench, an upper part of a side wall continued from the opening of the trench has a curved surface convex to an outside, and a lower part of the side wall continuously connected to the bottom of the trench has a curved surface convex to the outside.

DETAILED DESCRIPTION

Figure 1:
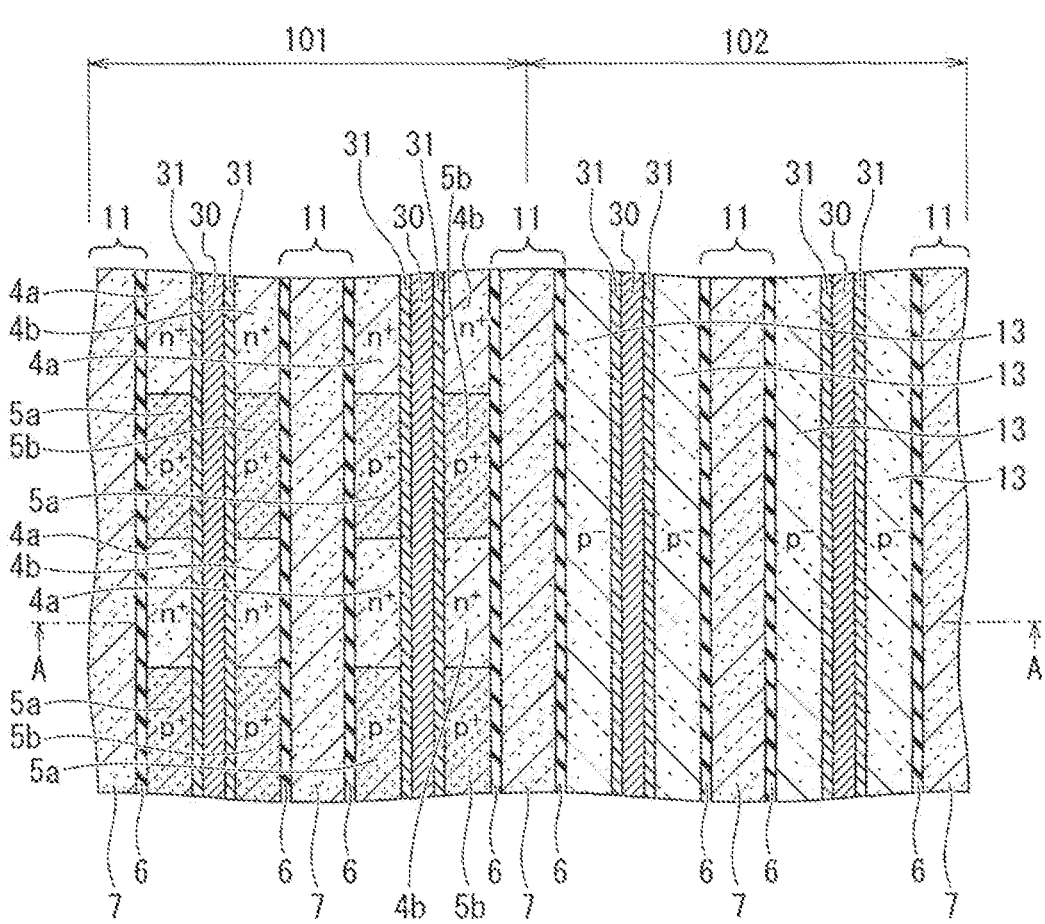
FIG. 1 is a horizontal cross-sectional view illustrating an example of a semiconductor device according to a first embodiment.

With reference to the drawings, first to fifth embodiments of the present invention will be described below.

In the drawings, the same or similar elements are indicated by the same or similar reference numerals. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the following description, a "first main electrode region" and a "second main electrode region" are a main electrode region of a semiconductor element, in which a main current flows in or out. The first main electrode region is assigned to a semiconductor region which is an emitter region or a collector region in an insulated-gate bipolar transistor (IGBT). The first main electrode region is assigned to a semiconductor region which is a source region or a drain region in a field-effect transistor (FET) or a static induction transistor (SIT). The first main electrode region is assigned to a semiconductor region which is an anode region or a cathode region in a static induction (SI) thyristor or a gate turn-off (GTO) thyristor. The second main electrode region is assigned to a semiconductor region which is not assigned as the first main electrode region and will be the emitter region or the collector region in the IGBT, the source region or the drain region in the FET or the SIT, and the anode region or the cathode region in the SI thyristor or the GTO thyristor. That is, when the first main electrode region is the source region, the second main electrode region means the drain region. When the first main electrode region is the emitter region, the second main electrode region means the collector region. When the first main electrode region is the anode region, the second main electrode region means the cathode region. A "main electrode region" is described in the specification, the main electrode region comprehensively means any one of the first main electrode region and the second main electrode region.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. In addition, an "upper surface" may be read as "front surface", and a "lower surface" may be read as "back surface".

Further, in the following description, there is exemplified a case where a first conductivity-type is an n-type and a second conductivity-type is a p-type. However, the relationship of the conductivity types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration or a relatively low specific resistance as compared to a semiconductor region denoted by the symbol "n" or "p" without "+". A semiconductor region denoted by the symbol "n" or "p" attached with "−" indicates that such semiconductor region has a relatively low impurity concentration or a relatively high specific resistance as compared to a semiconductor region denoted by the symbol "n" or "p" without "−". However, even when the semiconductor regions are denoted by the same reference symbols "n" and "n", it is not indicated that the semiconductor regions have exactly the same impurity concentration or the same specific resistance.

First Embodiment

<Structure of Semiconductor Device>

FIG. 1 is a horizontal cross-sectional view illustrating a part of an active region of a semiconductor device according to a first embodiment as viewed from the top surface (the front surface) side. As illustrated in FIG. 1, the semiconductor device according to the first embodiment includes a transistor part 101 including a transistor element such as an IGBT, and a diode part 102 including a diode element, in which the transistor part 101 and the diode part 102 are integrated on the same semiconductor chip. The semiconductor device according to the first embodiment is a reverse-conducting IGBT (a RC-IGBT), for example, in which an IGBT that is the transistor part 101 and a freewheeling diode (FWD) that is the diode part 102 connected in antiparallel to the IGBT are integrated on the same semiconductor chip. A plurality of transistor parts 101 and diode parts 102 may be arranged alternately in the right-left direction in FIG. 1.

Figure 2:
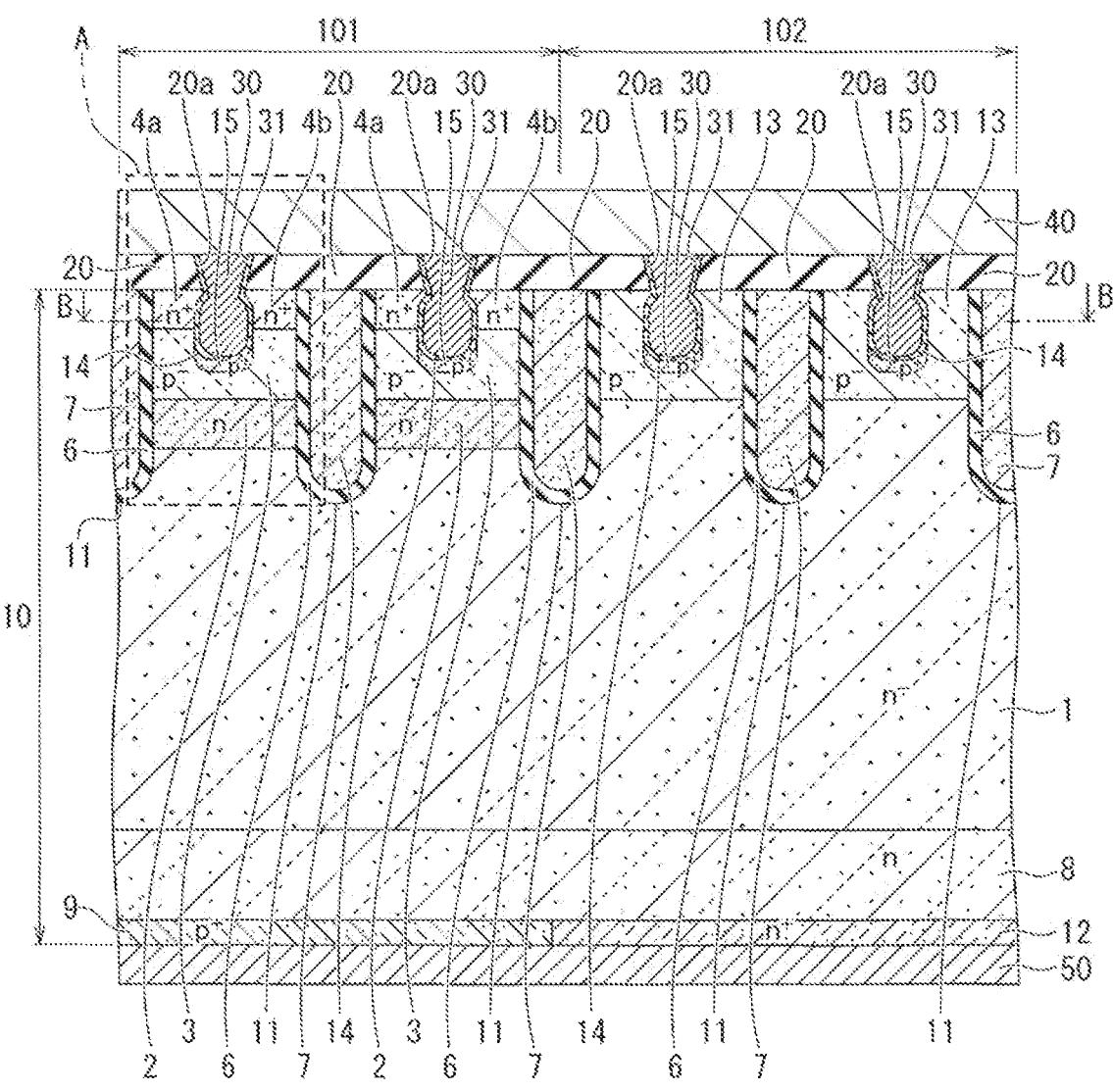
FIG. 2 is a vertical cross-sectional view as viewed from the direction of line A-A in FIG. 1.

FIG. 2 is a vertical cross-sectional view taken along line A-A cross-sectioned across the transistor part 101 and the diode part 102 in FIG. 1. The horizontal cross section taken along line B-B in FIG. 2 corresponds to FIG. 1. As illustrated in FIG. 2, the semiconductor device according to the first embodiment includes a semiconductor substrate 10. The semiconductor substrate 10 is a silicon (Si) substrate, for example. The semiconductor substrate 10 is not limited to the Si substrate, and may be any other semiconductor substrate of a semiconductor (a wide band-gap semiconductor) having a wider band gap than Si, such as silicon carbide (SiC), gallium nitride (GaN), gallium oxide (Ga$_2$O$_3$), diamond (C), or aluminum nitride (AlN).

The semiconductor substrate 10 includes a drift layer 1 of a first conductivity-type (n$^-$-type). An accumulation layer 2 of n-type having a higher impurity concentration than the drift layer 1 is deposited on the top surface side of the drift layer 1 in the transistor part 101. The bottom surface of the accumulation layer 2 is in contact with the top surface of the drift layer 1. The presence of the accumulation layer 2 can enhance an effect of promoting a carrier injection enhancement effect (an IE effect) so as to decrease an ON-voltage.

The transistor part 101 includes a base region 3 of a second conductivity-type (p$^-$-type) deposited on the top surface side of the accumulation layer 2. The bottom surface of the base region 3 is in contact with the top surface of the accumulation layer 2. First main electrode regions (emitter regions) 4a and 4b of n$^+$-type are deposited on the top surface side of the base region 3. The respective bottom surfaces of the emitter regions 4a and 4b are in contact with the top surface of the base region 3. The emitter regions 4a and 4b each have a higher impurity concentration than the drift layer 1 and the accumulation layer 2.

The top surface side of the drift layer 1 in the diode part 102 is not provided with any accumulation layer as provided in the transistor part 101. An accumulation layer of n-type having a higher impurity concentration than the drift layer 1 may also be provided on the top surface side of the drift layer 1 in the diode part 102. An anode region 13 of p$^-$-type is deposited on the top surface side of the drift layer 1 in the diode part 102. The bottom surface of the anode region 13 is in contact with the top surface of the drift layer 1. The anode region 13 is deposited to have a top surface located at the same level as the top surface of the semiconductor substrate 10. The anode region 13 may be provided to have the same depth and the same impurity concentration as the base region 3 in the transistor part 101.

A plurality of trenches (gate trenches) 11 are provided separately from each other extending from the top surface of the semiconductor substrate 10 in the depth direction that is perpendicular to the top surface of the semiconductor substrate 10 in each of the transistor part 101 and the diode part 102. The respective gate trenches 11 in the transistor part 101 penetrate the respective emitter regions 4a and 4b, the base region 3, and the accumulation layer 2 so as to reach the drift layer 1. The respective side surfaces of the emitter regions 4a and 4b, the base region 3, and the accumulation layer 2 are in contact with the side surfaces (the side wall surfaces) of the respective gate trenches 11. The gate trenches 11 in the diode part 102 penetrate the anode region 13 so as to reach the drift layer 1. The side surfaces of the anode region 13 are in contact with the side surfaces of the respective gate trenches 11.

The region between the respective gate trenches 11 next to each other is provided with a mesa part implemented by the upper part of the semiconductor substrate 10 in the parallel direction of the respective gate trenches 11. The mesa part is a region of the semiconductor substrate 10 interposed between the respective gate trenches 11 next to each other, and is located above the deepest part of the gate trenches 11. The upper part of the drift layer 1, the accumulation layer 2, the base region 3, and the emitter regions 4a and 4b are provided in the mesa part in the transistor part 101. The upper part of the drift layer 1 and the anode region 13 are provided in the mesa part in the diode part 102.

A gate insulating film 6 is provided to cover the bottom and the side surface of the respective gate trenches 11. The gate insulating film 6 as used herein can be a single film of a silicon dioxide film (a SiO$_2$ film), a silicon oxynitride (SiON) film, a strontium oxide (SrO) film, a silicon nitride (Si$_3$N$_4$) film, an aluminum oxide (Al$_2$O$_3$) film, a magnesium oxide (MgO) film, an yttrium oxide (Y$_2$O$_3$) film, a hafnium oxide (HfO$_2$) film, a zirconium oxide (ZrO$_2$) film, a tantalum oxide (Ta$_2$O$_5$) film, or a bismuth oxide (B$_2$O$_3$) film, or a composite film including some of the above films stacked on one another.

A gate electrode 7 is buried inside the respective gate trenches 11 with the gate insulating film 6 interposed. The gate insulating film 6 and the gate electrode 7 implement an insulated gate electrode structure (6, 7). The gate electrode 7 as used herein can be made of a polysilicon film (a doped polysilicon film) heavily doped with impurity ions such as phosphorus (P) or boron (B), for example.

Some of the plural insulated gate electrode structures (6, 7) in the transistor part 101 serve as a gate trench unit connected to a gate runner, while the other may serve as a dummy trench unit not connected to the gate runner. The respective insulated gate electrode structures (6, 7) in the diode part 102 may each serve as a dummy trench unit not connected to the gate runner.

As illustrated in FIG. 1, the plural gate trenches 11 each have a straight (stripe-shaped) part extending parallel to each other in one direction (the upper-lower direction in FIG. 1) in the planar pattern. The anode region 13 in the diode part 102 has a straight (stripe-shaped) part extending parallel to the extending direction of the respective gate trenches 11.

A contact region 5a of p$^+$-type and the emitter region 4a of n$^+$-type are alternately and repeatedly arranged parallel to the extending direction (the longitudinal direction) of the respective gate trenches 11 in the transistor 101, and a contact region 5b of p$^+$-type and the emitter region 4b of n$^+$-type are alternately and repeatedly arranged in the same matter. The contact region 5a is in contact with the emitter region 4a. The contact region 5b is in contact with the emitter region 4b. The contact regions 5a and 5b are deposited on the top surface side of the base region 3 illustrated in FIG. 2. The bottom surfaces of the respective contact regions 5a and 5b are in contact with the top surface of the base region 3. The respective contact regions 5a and 5b have a higher impurity concentration than the base region 3.

As illustrated in FIG. 2, an interlayer insulating film 20 is deposited on the top surfaces of the semiconductor substrate 10 and the respective insulated gate electrode structures (6, 7). The interlayer insulating film 20 is a single film of a silicon oxide film (a SiO$_2$ film) without containing phosphorus (P) or boron (B) which is referred to as a non-doped silicate glass (NSG) film, a phosphosilicate glass film (a PSG film), a borosilicate glass film (a BSG film), a boro-phosphosilicate glass film (a BPSG film), a silicon nitride (Si$_3$N$_4$) film, or a high temperature oxide film (a HTO film), or a stacked layer of the above films stacked on one another.

The interlayer insulating film 20 located on the mesa part of the semiconductor substrate 10 between the respective gate trenches 11 is provided with contact holes 20a penetrating the interlayer insulating film 20. The mesa part of the semiconductor substrate 10 between the respective gate trenches 11 is provided with trenches (contact trenches) 14 connected integrally with the contact holes 20a. The respective contact trenches 14 are dug from the top surface of the mesa part in the depth direction perpendicular to the top surface of the mesa part.

A contact plug 30 is buried in the respective contact trenches 14 and the respective contact holes 20a with a barrier metal film 31 interposed. The barrier metal film 31 to be used can be a metallic film such as a single film made from titanium (Ti) or titanium nitride (TiN) or a stacked film including Ti and TiN, for example. The contact plug 30 may be made from conductive material of metal such as tungsten (W).

Figure 3:
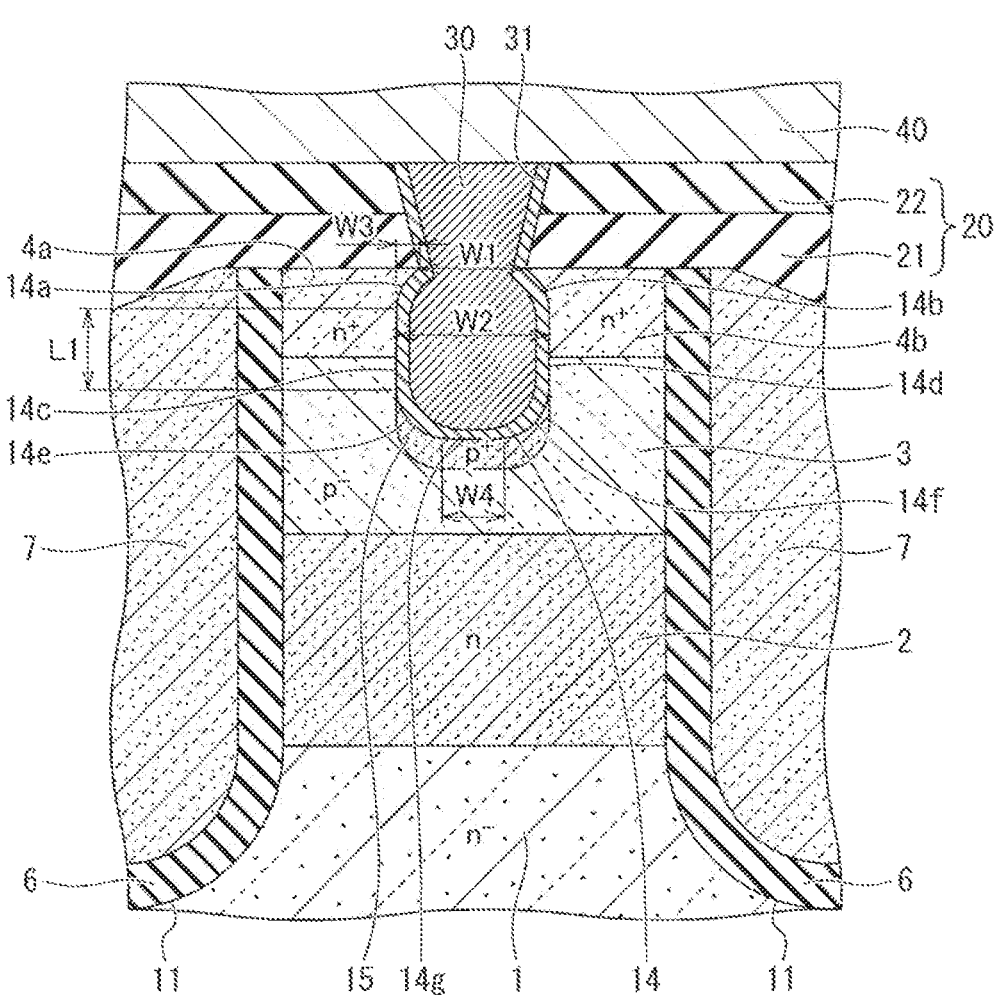
FIG. 3 is an enlarged cross-sectional view of region A in FIG. 2.

FIG. 3 is an enlarged view illustrating region A in FIG. 2 including the circumference of the contact trench 14 in the transistor part 101. The circumference of the other contact trenches 14 illustrated in FIG. 2 each have the same structure as the enlarged view illustrated in FIG. 3. As illustrated in FIG. 3, the interlayer insulating film 20 includes a first insulating film 21 of a HTO film or the like, and a second insulating film 22 of a BPSG film or the like deposited on the top surface of the first insulating film 21. The respective emitter regions 4a and 4b have a thickness in a range of about 0.3 micrometers or greater and less than 0.6 micrometers, for example. A gap between the respective gate trenches 11 next to each other is in a range of about 0.5 micrometers or greater and 1.0 micrometers or smaller.

As illustrated in FIG. 3, the contact trench 14 is provided in the mesa part between the respective gate trenches 11 next to each other. The contact trench 14 penetrates the emitter regions 4a and 4b to reach the base region 3. The contact trench 14 has a width (an opening width) W1 at the opening that conforms to a width at the lower end of the contact hole 20a. The opening width W1 of the contact trench 14 is in a range of about greater than 0.1 micrometers and 0.5 micrometers or smaller, for example.

The contact trench 14 has side walls (14a. 14c, 14e)(14b, 14d, 14f) and a bottom (a bottom part) 14g. The side walls (14a, 14c, 14e) (14b, 14d, 14f) of the contact trench 14 include upper parts (upper side walls) 14a and 14b continued from the opening located at the upper end of the contact trench 14, middle parts 14c and 14d continuously connected to the upper parts 14a and 14b, and lower parts (lower side walls) 14e and 14f continuously connected to the middle parts 14c and 14d and the bottom 14g. The middle parts 14c and 14d and the bottom 14g are not necessarily provided. The contact trench 14 in such a case includes the upper parts 14a and 14b and the lower parts 14e and 14f continuously connected to the upper parts 14a and 14b.

The upper parts 14a and 14b each have a curved surface convex to the outside of the contact trench 14 so as to increase the width of the contact trench 14 as the depth of the contact trench 14 increases.

The middle parts 14c and 14d of the contact trench 14 are each a flat part having a flat surface substantially parallel to the depth direction of the contact trench 14 (the direction normal to the top surface of the mesa part). The flat part of the respective middle parts 14c and 14d extends across the interface of the p-n junction between the respective emitter regions 4a and 4b and the base region 3. A length L1 of the flat surface of the respective middle parts 14a and 14d can be adjusted as appropriate. The middle parts 14c and 14d may each have a curved surface instead. The contact trench 14 has the maximum width W2 at a position corresponding to the respective middle parts 14c and 14d. The maximum width W2 of the contact trench 14 is greater than the opening width W1 of the contact trench 14, and is in a range of about 0.1 micrometers or greater and less than 0.5 micrometers, for example.

A protruding width (an overhanging amount) W3 of the respective emitter regions 4a and 4b in the horizontal direction at the position corresponding to the opening of the contact trench 14 on the basis of the middle parts 14c and 14d having the maximum width W3 (W3={W2−W1}/2) is in a range of about 3 nanometers or greater and 30 nanometers or smaller, for example. When the protruding width W3 of the emitter regions 4a and 4b is 3 nanometers or greater, the impurity ions upon the implantation into the bottom of the contact trench 14 can be prevented from being implanted into the side walls of the contact trench 14. A method of manufacturing the semiconductor device is described below. When the protruding width W3 of the emitter regions 4a and 4b is 30 nanometers or smaller, the barrier metal film 31 can be prevented from being benched.

The protruding width W3 of the emitter regions 4a and 4b is more preferably in a range of about 10 nanometers or greater and 20 nanometers or smaller, for example. The impurity ions can be prevented from being implanted into the side walls of the contact trench 14 more effectively when the protruding width W3 is 10 nanometers or greater. In addition, the barrier metal film 31 can be prevented from being benched more effectively when the protruding width W3 is 20 nanometers or smaller.

The lower parts 14e and 14f of the contact trench 14 each have a curved surface convex to the outside of the contact trench 14 so as to decrease the width of the contact trench 14 as the depth of the contact trench 14 increases.

The bottom 14*g* is a flat part having a flat surface perpendicular to the depth direction of the contact trench 14. A width W4 of the flat surface of the bottom 14*g* can be regulated as appropriate. The bottom 14*g* may have a curved surface instead. A depth of the contact trench 14 from the opening to the bottom 14*g* is in a range of about 0.2 micrometers or greater and 1.0 micrometers or smaller, for example.

A contact region 15 of p⁺-type having a higher impurity concentration than the base region 3 is deposited under the bottom 14*g* of the contact trench 14 so as to be in contact with the bottom 14*g*. The contact region 15 is located inside the base region 3 and is in contact with the base region 3. The contact region 15 may be provided so as to be in contact with the accumulation layer 2 under the base region 3. The contact region 15 provided together with the contact plug 30 can decrease a contact resistance between the contact region 15 and the contact plug 30. The contact region 15 is provided separately from the emitter regions 4*a* and 4*b*.

The contact plug 30 buried in the contact trench 14 is in ohmic contact with the respective emitter regions 4*a* and 4*b* and the contact region 15. The contact plug 30 in the diode part 102 illustrated in FIG. 2 is in ohmic contact with the contact region 15 provided at the upper part of the anode region 13.

As illustrated in FIG. 1, the contact plug 30 has a straight (stripe-shaped) part extending parallel to the longitudinal direction of the respective gate trenches 11 in the planar pattern. The contact region 15 hidden under the contact plug 30 also extends parallel to the contact plug 30. The respective contact plugs 30 in the transistor part 101 are arranged between the emitter regions 4*a* and 4*b* and the contact regions 5*a* and 5*b*. The respective contact plugs 30 in the diode part 102 are arranged repeatedly in the anode region 13.

As illustrated in FIG. 2, a front-surface electrode 40 is deposited on the interlayer insulating film 20. The front-surface electrode 40 in the transistor part 101 is electrically connected to the emitter regions 4*a* and 4*b* and the contact regions 5*a* and 5*b* via the respective contact plugs 30 so as to serve as an emitter electrode. The front-surface electrode 40 in the diode part 102 is electrically connected to the anode region 13 via the respective contact plugs 30 so as to serve as an anode electrode. The front-surface electrode 40 as used herein can be made from metal such as aluminum (Al), an Al alloy, or copper (Cu). Examples of Al alloys include an Al-silicon (Si) alloy, an Al—Cu—Si alloy, and an Al—Cu alloy.

As illustrated in FIG. 2, a field-stop (FS) layer 8 of n-type having a higher impurity concentration than the drift layer 1 is deposited on the bottom surface side of the drift layer 1 in both the transistor part 101 and the diode part 102. The top surface of the FS layer 8 is in contact with the bottom surface of the drift layer 1. The FS layer 8 prevents a depletion layer that expands from the bottom surface side of the base region 3 and the anode region 13 from reaching a second main electrode region (a collector region) 9 and a cathode region 12 described below.

The collector region 9 of p⁺-type is deposited on the bottom surface side of the FS layer 8 in the transistor part 101. The top surface of the collector region 9 is in contact with the bottom surface of the FS layer 8. The collector region 9 has a higher impurity concentration than the base region 3. The cathode region 12 of n⁺-type having a higher impurity concentration than the FS layer 8 is deposited on the bottom surface side of the FS layer 8 in the diode part 102. The top surface of the cathode region 12 is in contact with the bottom surface of the FS layer 8. The cathode region 12 is provided at the same depth as the FS layer 8. The side surface of the cathode region 12 is in contact with the side surface of the collector region 9.

A rear-surface electrode 50 is deposited on the bottom surface side of the collector region 9 and the cathode region 12. The rear-surface electrode 50 is made of a single film of gold (Au) or a metallic film including titanium (Ti), nickel (Ni), and gold (Au) stacked together in this order, for example. The rear-surface electrode 50 serves as a collector electrode in the transistor part 101, and serves as a cathode electrode in the diode part 102.

The semiconductor device according to the first embodiment during the operation applies a positive voltage to the rear-surface electrode 50 while using the front-surface electrode 40 as a ground potential in the transistor part 101, and causes an inversion layer (a channel) to be formed in the base region 3 on the side surface side of the respective gate trenches 11 so as to be led to be the ON-state when a positive voltage of a threshold or greater is applied to the gate electrode 7. In the ON-state, a current flows from the rear-surface electrode 50 toward the front-surface electrode 40 through the collector region 9, the FS layer 8, the drift layer 1, the accumulation layer 2, the inversion layer of the base region 3, and the emitter regions 4*a* and 4*b*.

When the voltage applied to the gate electrode 7 is smaller than the threshold, the semiconductor device is led to be the OFF-state since no inversion channel is formed in the base region 3, and no current flows from the rear-surface electrode 50 toward the front-surface electrode 40. The diode part 102 allows a freewheeling current to flow in the opposite direction when the transistor part 101 is turned off.

<Method of Manufacturing Semiconductor Device>

An example of a method of manufacturing the semiconductor device according to the first embodiment is described below. The method of manufacturing the semiconductor device described below is one of examples, and it should be understood that the semiconductor device according to the first embodiment can be achieved by various manufacturing methods including modified examples within the scope of the appended claims.

Figure 4:
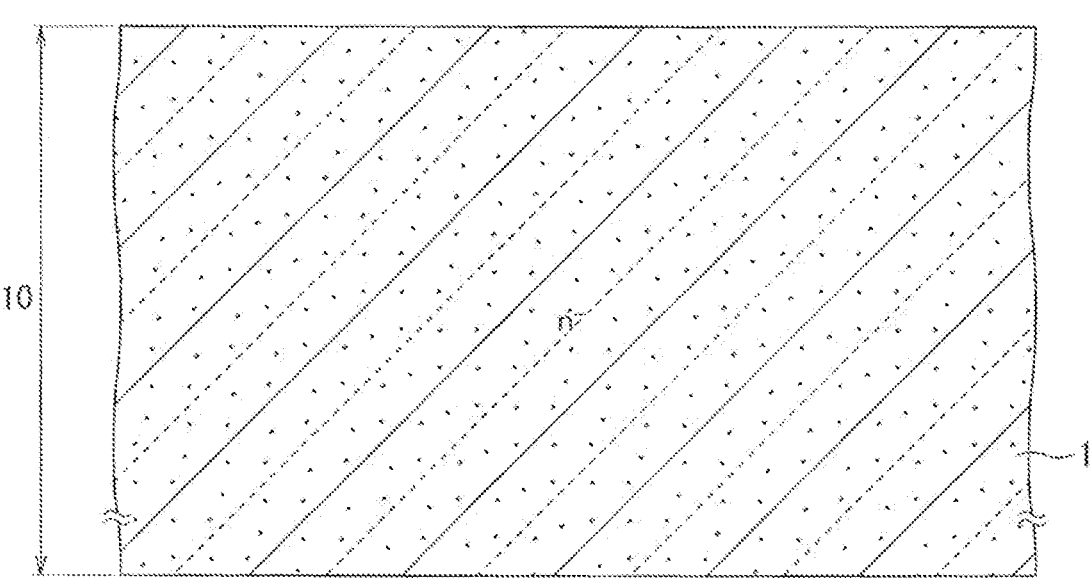
FIG. 4 is a cross-sectional process view illustrating an example of a method of manufacturing the semiconductor device according to the first embodiment.
Figure 5:
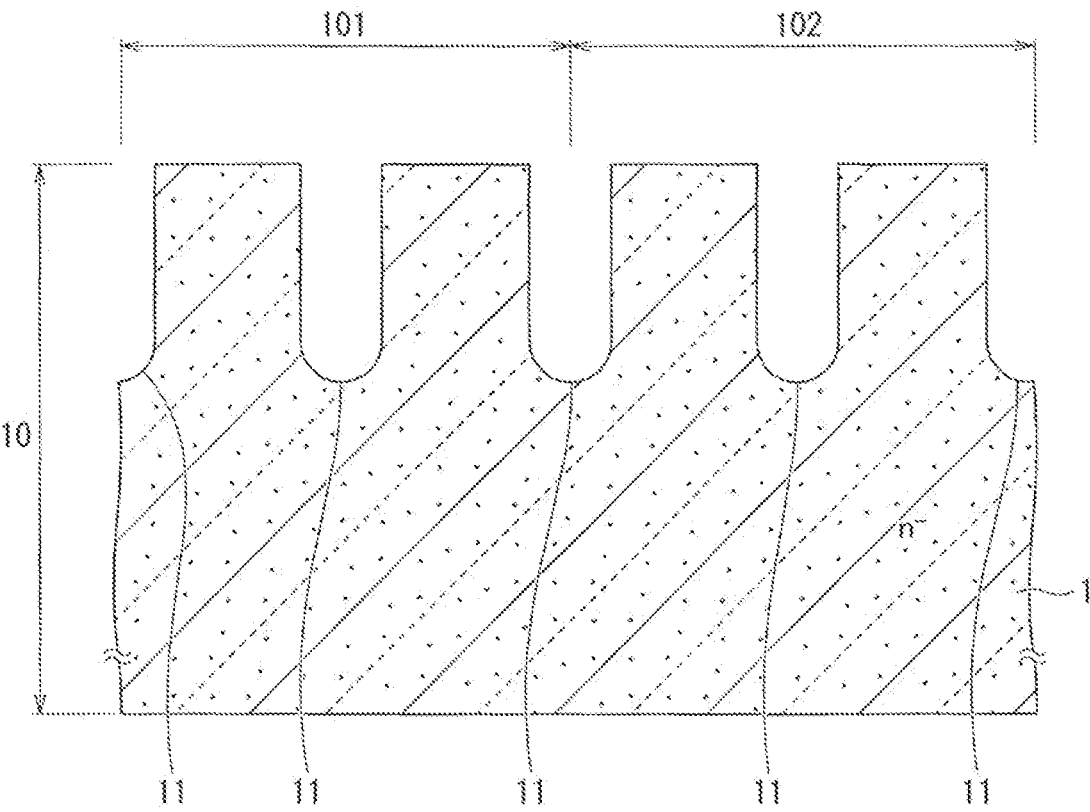
FIG. 5 is a cross-sectional process view continued from FIG. 4, illustrating the example of the method of manufacturing the semiconductor device according to the first embodiment.

First, the semiconductor substrate 10 of the first conductivity-type (n⁻-type) made of a silicon (Si) wafer or the like is prepared, as illustrated in FIG. 4. Next, the drift layer 1 is partly and selectively removed from the top surface side of the semiconductor substrate 10 by photolithography and dry etching. The plural gate trenches 11 are thus formed at the upper part of the semiconductor substrate 10, as illustrated in FIG. 5.

Figure 6:
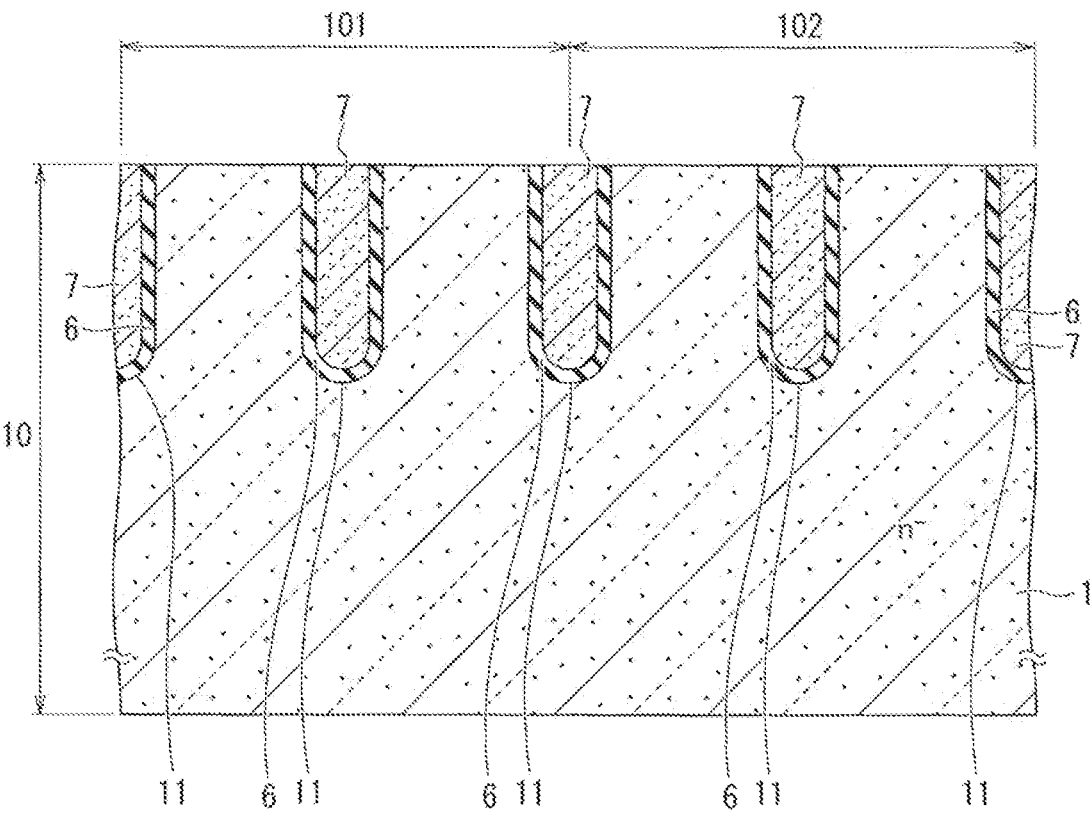
FIG. 6 is a cross-sectional process view continued from FIG. 5, illustrating the example of the method of manufacturing the semiconductor device according to the first embodiment.

Next, the gate insulating film 6 is formed on the bottom and the side surface of the respective gate trenches 11 by a thermal oxidation method or a chemical vapor deposition (CVD) method, for example. A polysilicon film (a doped polysilicon film) heavily doped with impurity ions such as phosphorus (P) or boron (B) is deposited so as to fill the inside of the respective gate trenches 11 with the gate insulating film 6 interposed by the CVD method and the like. The polysilicon film and the gate insulating film 6 on the semiconductor substrate 10 are then selectively removed by photolithography and dry etching. The insulated gate electrode structure (6, 7) implemented by the gate insulating film 6 and the gate electrode 7 of the polysilicon film is thus formed in the respective gate trenches 11, as illustrated in FIG. 6.

Next, p-type impurity ions such as boron (B) are implanted into the entire top surface of the drift layer 1 so as to form the p⁻-type base region 3 in the transistor part 101 simultaneously together with the p⁻-type anode region 13 in the diode part 102. The photoresist film is then removed.

Next, a photoresist film is applied on the top surface of the drift layer 1, and is then delineated by photolithography. Using the delineated photoresist film as a mask for ion implantation, n-type impurity ions such as phosphorus (P) or arsenic (As) are implanted so as to form the n-type accumulation layer 2 in the transistor part 101. The photoresist film is then removed.

Next, a photoresist film is applied on the top surface of the drift layer 1, and is then delineated by photolithography. Using the delineated photoresist film as a mask for ion implantation, p-type impurity ions such as boron (B) are implanted so as to form the p⁺-type contact regions 5a and 5b in the transistor part 101 (refer to FIG. 1). The photoresist film is then removed.

Next, a photoresist film is applied on the top surface of the drift layer 1, and is then delineated by photolithography. Using the delineated photoresist film as a mask for ion implantation, n-type impurity ions are implanted so as to form the n⁺-type emitter regions 4a and 4b in the transistor part 101. The photoresist film is then removed. The order of the ion implantation for forming the accumulation layer 2, the ion implantation for forming the base region 3 and the anode region 13, the ion implantation for forming the emitter regions 4a and 4b, and the ion implantation for forming the contact regions 5a and 5b can be determined and changed as appropriate.

Figure 7:
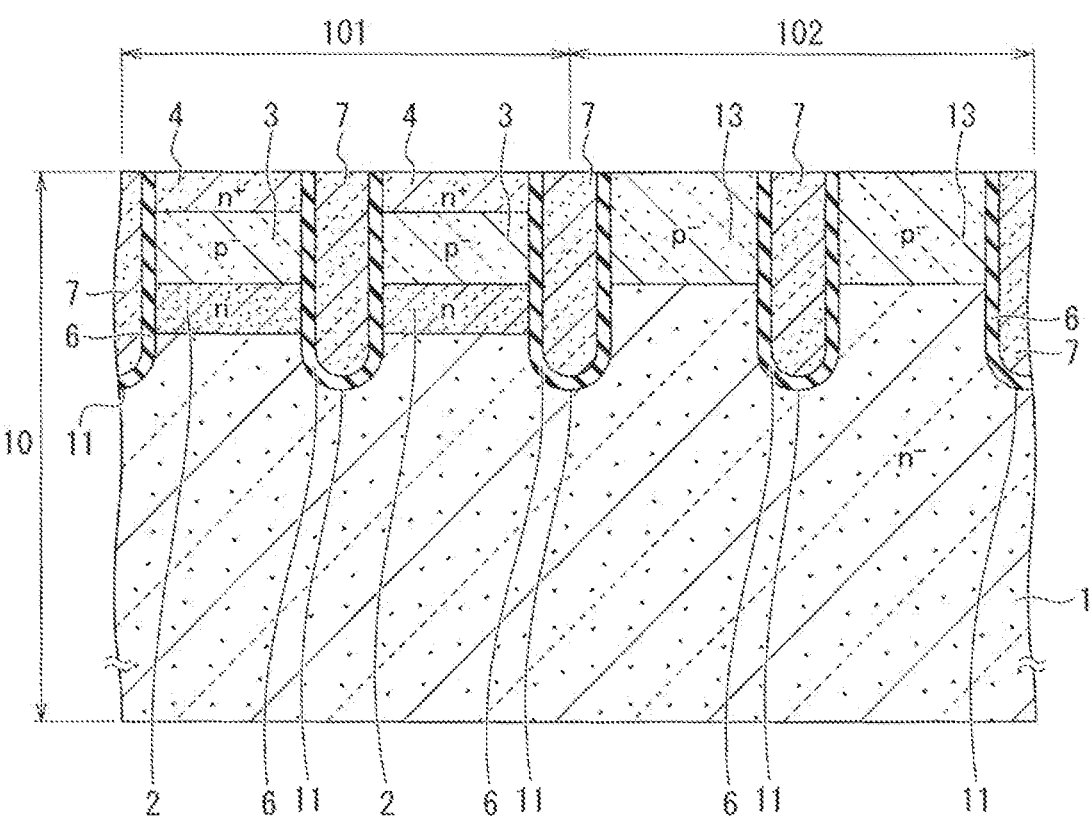
FIG. 7 is a cross-sectional process view continued from FIG. 6, illustrating the example of the method of manufacturing the semiconductor device according to the first embodiment.

Next, the impurity ions implanted into the semiconductor substrate 10 are activated by annealing. The upper part of the semiconductor substrate 10 in the transistor part 101 is thus provided with the n-type accumulation layer 2, the p⁻-type base region 3, the n⁺-type emitter region 4, and the p⁺-type contact region (refer to FIG. 1), as illustrated in FIG. 7. Similarly, the upper part of the semiconductor substrate 10 in the diode part 102 is provided with the p⁻-type anode region 13.

Figure 8:
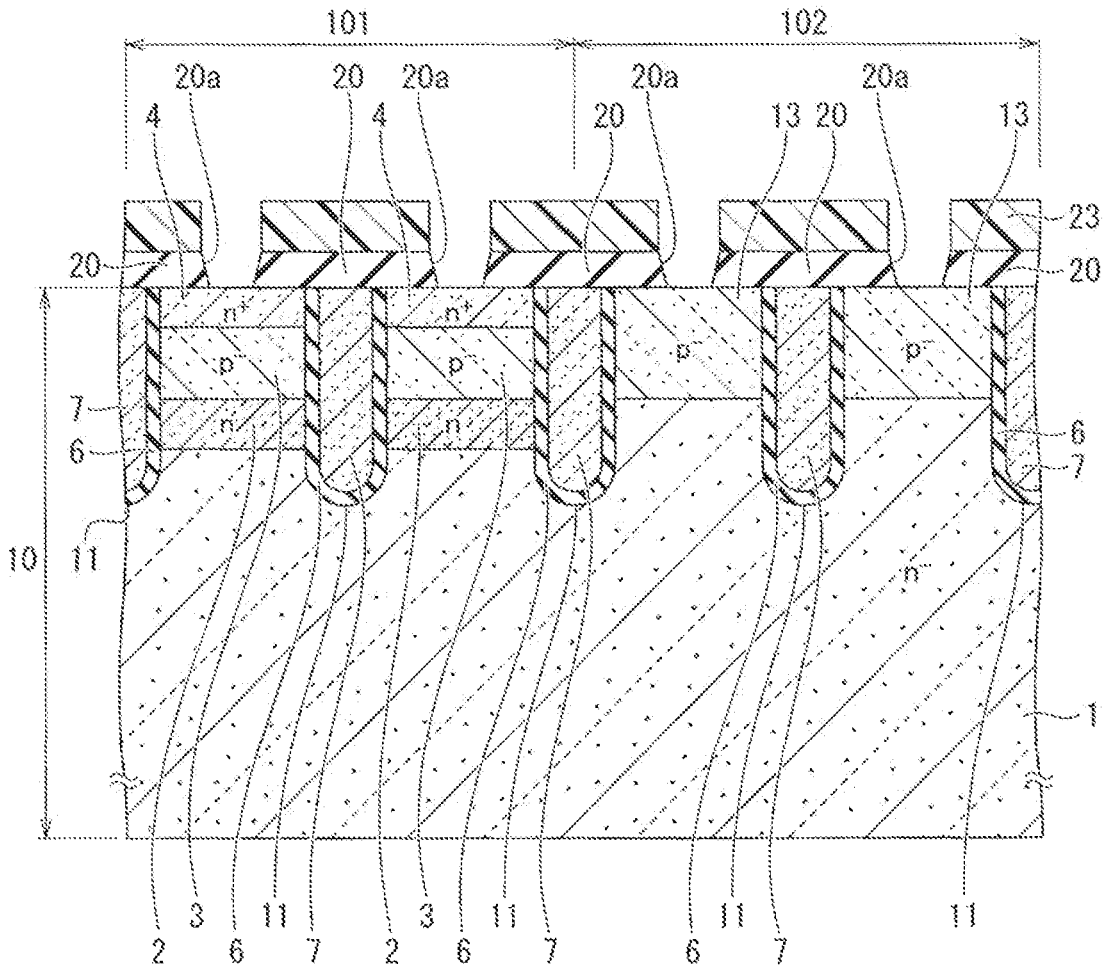
FIG. 8 is a cross-sectional process view continued from FIG. 7, illustrating the example of the method of manufacturing the semiconductor device according to the first embodiment.

Next, the interlayer insulating film 20 is formed by the CVD method and the like on the respective top surfaces of the insulated gate electrode structures (6, 7), the emitter region 4, and the anode region 13. A photoresist film 23 is then applied on the top surface of the interlayer insulating film 20, and is delineated by photolithography. Using the delineated photoresist film 23 as a mask for etching, the interlayer insulating film 20 is partly and selectively removed by dry etching. This step opens the contact holes 20a in the interlayer insulating film 20 to which the emitter region 4 and the anode region 13 are partly exposed, as illustrated in FIG. 8.

Figure 9:
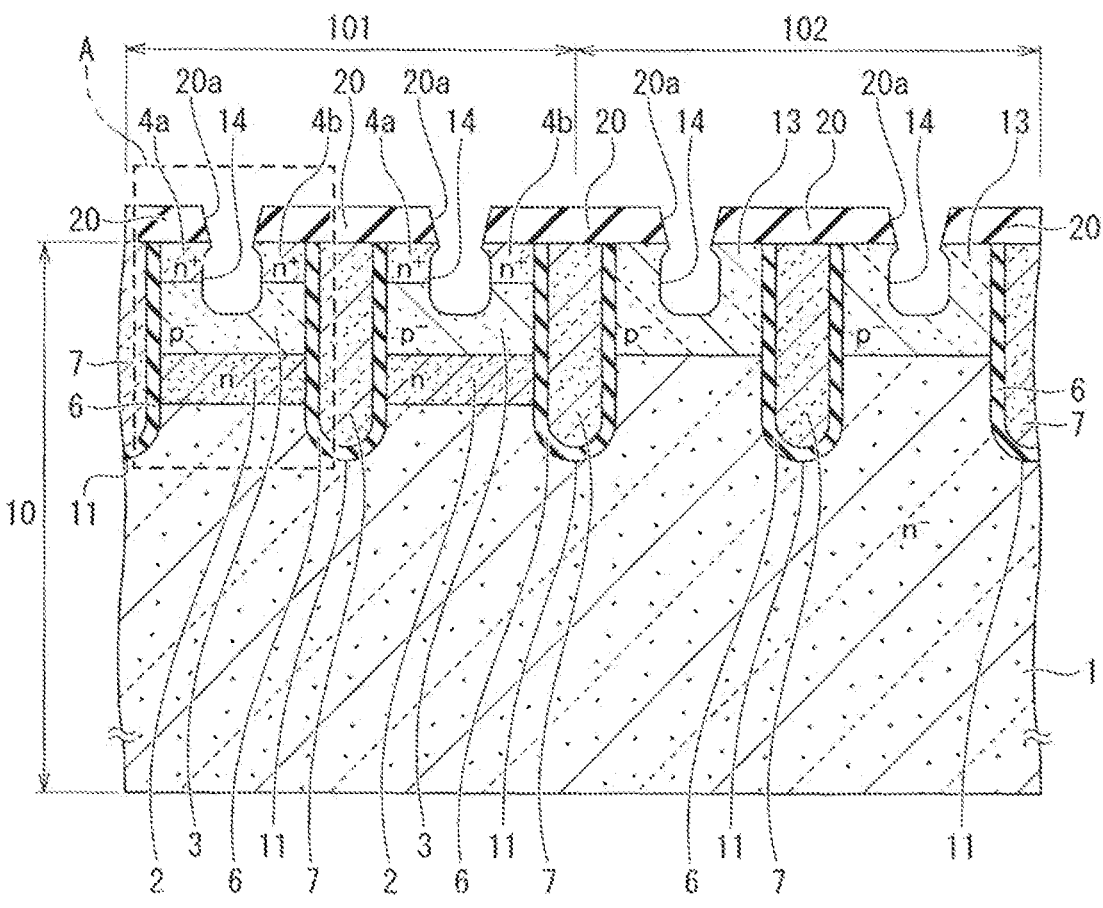
FIG. 9 is a cross-sectional process view continued from FIG. 8, illustrating the example of the method of manufacturing the semiconductor device according to the first embodiment.

Next, using the interlayer insulating film 20 as a mask for etching, the emitter region 4 and the base region 3 in the mesa part in the transistor part 101 and the anode region 13 in the diode part 102 are partly and selectively removed by dry etching such as reactive ion etching (RIE). The contact trenches 14 are thus formed continuously with the contact holes 20a so as to penetrate the emitter region 4 to reach the base region 3 in the transistor part 101, as illustrated in FIG. 9. The emitter region 4 is divided by the contact trenches 14 so as to provide the respective emitter regions 4a and 4b in the transistor part 101. The contact trenches 14 are also formed continuously with the contact holes 20a at the upper part of the anode region 13 in the diode part 102. The photoresist film 23 is then removed.

The respective contact trenches 14 are formed to have a structure in which the opening width at the lower end of the contact hole 20a and the opening width W1 of the contact trench 14 conform to each other, the respective upper parts 14a and 14b of the side walls (14a, 14c. 14e)(14b, 14d, 14f) continued from the opening of the contact trench 14 have a curved surface convex to the outside, and the respective lower parts 14e and 14f continued from the bottom 14g of the contact trench 14 have a curved surface convex to the outside. The shape of the contact trenches 14 can be controlled by the regulation of the etching conditions. For example, the type and the pressure of halogen-series gas can be adjusted so as to increase a tendency of isotropic etching in the RIE. The isotropic etching such as chemical dry etching (CDE) may be used upon the formation of the contact trenches 14.

Figure 10:
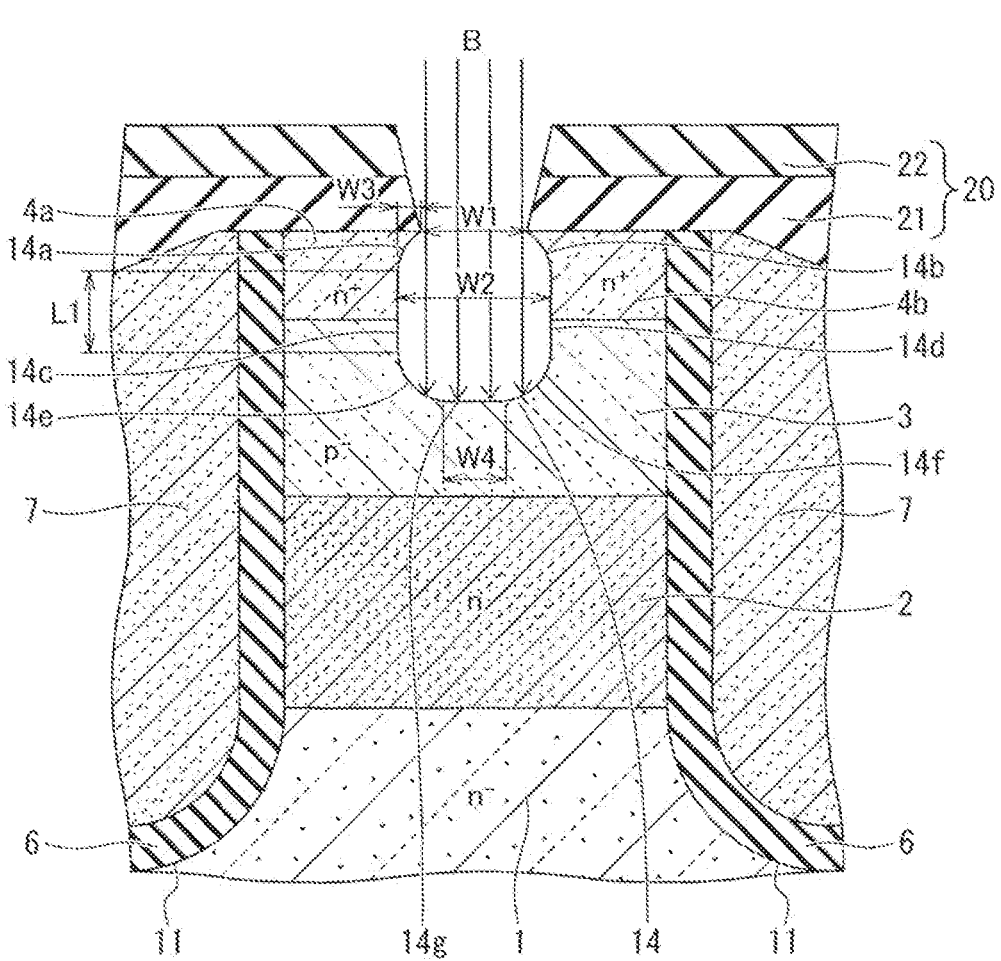
FIG. 10 is a cross-sectional process view continued from FIG. 9, illustrating the example of the method of manufacturing the semiconductor device according to the first embodiment.

FIG. 10 is a cross-sectional process view continued from FIG. 9, and is an enlarged view illustrating region A in FIG. 9. As illustrated in FIG. 10, the p-type impurity ions are implanted into the bottom of the respective contact trenches 14 in the direction substantially perpendicular to the bottom of the contact trenches 14. The p-type impurity ions to be implanted can be boron (B), boron fluoride (BF₂), or aluminum (Al), for example, and B is used in this case. The present embodiment can decrease or avoid the implantation of the p-type impurity ions into the side walls (14a, 14c, 14e)(14b, 14d, 140) on both sides of the respective contact trenches 14 upon the ion implantation of the p-type impurity ions as illustrated in FIG. 10, since the upper parts 14a and 14b of the respective contact trenches 14 have the curved surfaces convex to the outside, and the maximum width W2 of the contact trenches 14 is greater than the opening width W1.

Figure 11:
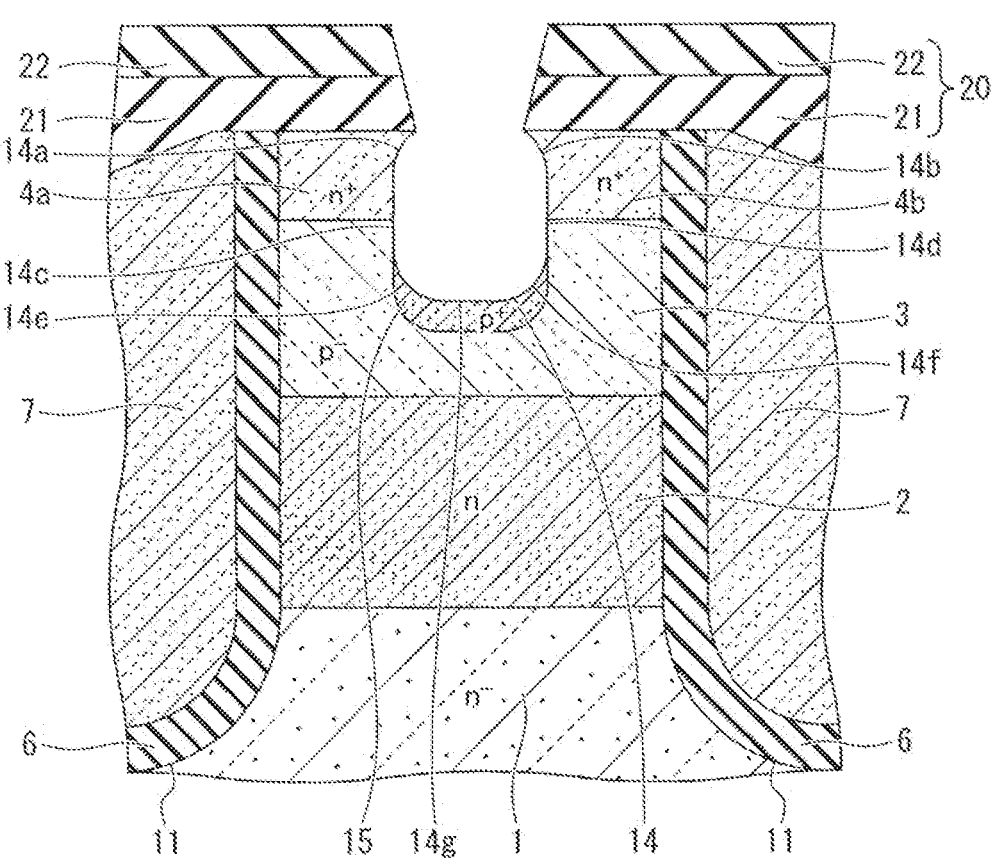
FIG. 11 is a cross-sectional process view continued from FIG. 10, illustrating the example of the method of manufacturing the semiconductor device according to the first embodiment.

The p-type impurity ions illustrated in FIG. 10 are activated by annealing such as rapid thermal annealing (RTA) after the ion implantation. This activation step forms the p⁺-type contact region 15 under the bottom 14g of the contact trench 14 so as to be in contact with the bottom 14g and the base region 3, as illustrated in FIG. 11. The spread of the contact region 15 in the lateral direction can be avoided at this point, since the implantation of the p-type impurity ions into the side walls (14a, 14c, 14e)(14b, 14d, 14f) on both sides of the contact trench 14 is prevented during the ion implantation step illustrated in FIG. 10.

Next, the barrier metal film 31 made from titanium (Ti) or titanium nitride (TiN) is deposited in the contact trenches 14 and the contact holes 20a by sputtering or vapor deposition and dry etching, for example. The structure at this point, in which the lower parts 4e and 14f of the contact trench 14 each have a curved surface, and the connected parts defined by the lower parts 14e and 14f and the bottom 14g do not have an angular shape but a rounded shape, can prevent the barrier metal film 31 from being cutoff. This can further avoid a separation of the barrier metal film 31 starting from cut-off parts of the barrier metal film 31.

Figure 12:
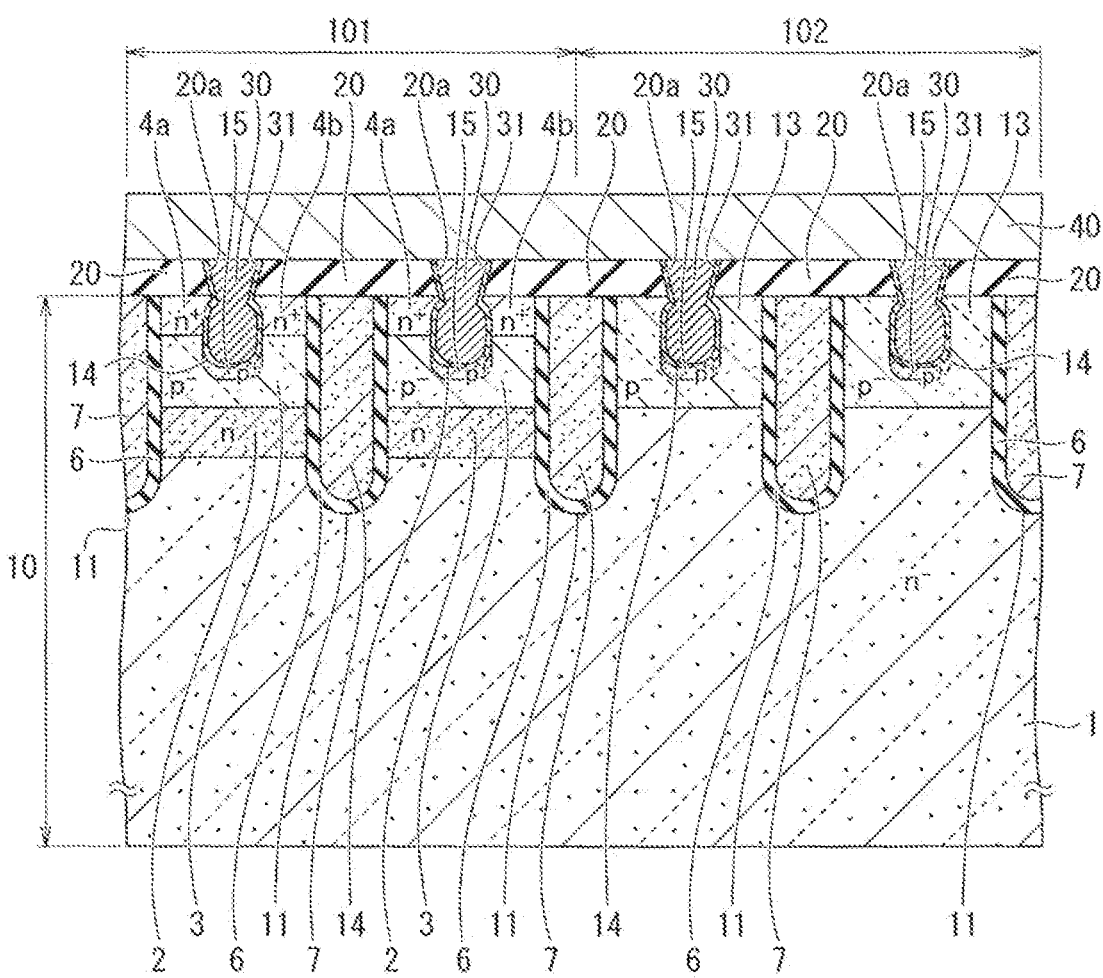
FIG. 12 is a cross-sectional process view continued from FIG. 11, illustrating the example of the method of manufacturing the semiconductor device according to the first embodiment.

Next, the contact trenches 14 and the contact holes 20a are each filled with the contact plug 30 made from tungsten (W) or the like with the barrier metal film 31 interposed by the CVD method and etch-back, for example. Next, the front-surface electrode 40 is deposited on the top surfaces of the contact plugs 30 and the interlayer insulating film 20 by sputtering or vapor deposition, for example, as illustrated in FIG. 12.

Next, the semiconductor substrate 10 is ground from the bottom surface side by chemical mechanical polishing (CMP), for example, so that the thickness of the semiconductor substrate 10 is adjusted to have an appropriate thickness of a final product. Next, n-type impurity ions such as phosphorus (P) or selenium (Se) for forming the n-type FS layer 8 are implanted into the entire bottom surface of the semiconductor substrate 10.

Next, p-type impurity ions such as boron (B) for forming the p$^+$-type collector region 9 are implanted into the entire bottom surface of the semiconductor substrate 10 at a lower acceleration voltage than that upon the ion implantation executed for forming the n-type FS layer 8.

Next, a photoresist film is applied to the bottom surface of the drift layer 1, and is delineated by photolithography. Using the delineated photoresist film as a mask for ion implantation, n-type impurity ions such as phosphorus (P) are implanted so as to form the n$^+$-type cathode region 12.

Figure 13:
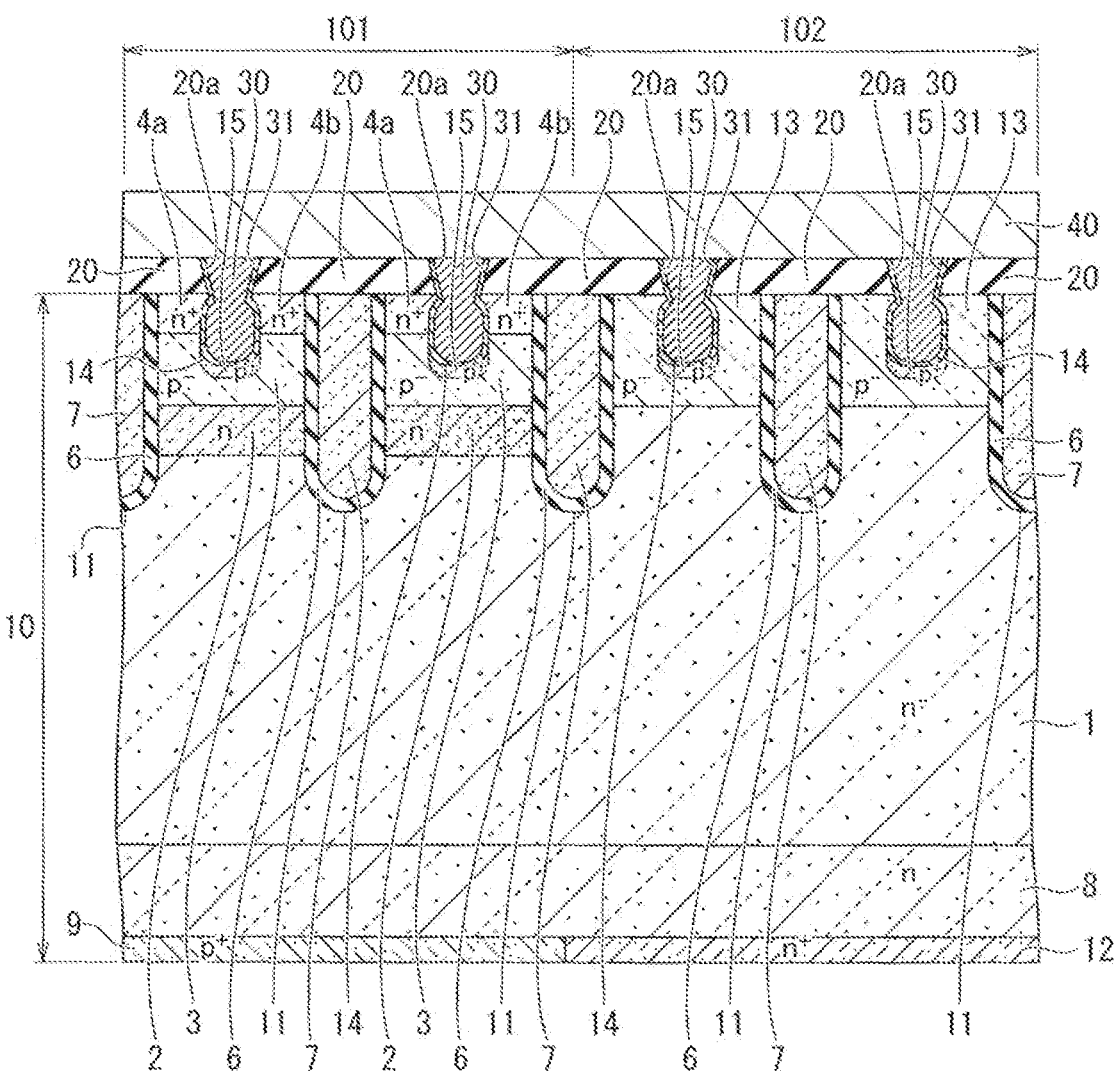
FIG. 13 is a cross-sectional process view continued from FIG. 12, illustrating the example of the method of manufacturing the semiconductor device according to the first embodiment.

Next, the impurity ions implanted into the semiconductor substrate 10 are activated by annealing. This step forms the FS layer 8 under the semiconductor substrate 10, as illustrated in FIG. 13. This step also forms the p$^+$-type collector region 9 in the transistor part 101 and the n$^+$-type cathode region 12 in the diode part 102.

Next, the rear-surface electrode 50 including gold (Au) is formed on the entire bottom surface of the semiconductor substrate 10 by sputtering or vapor deposition, for example. Thereafter, the semiconductor substrate 10 is cut (diced) into individual pieces, so as to complete the semiconductor device according to the first embodiment as illustrated in FIG. 1 to FIG. 3.

Figure 14:
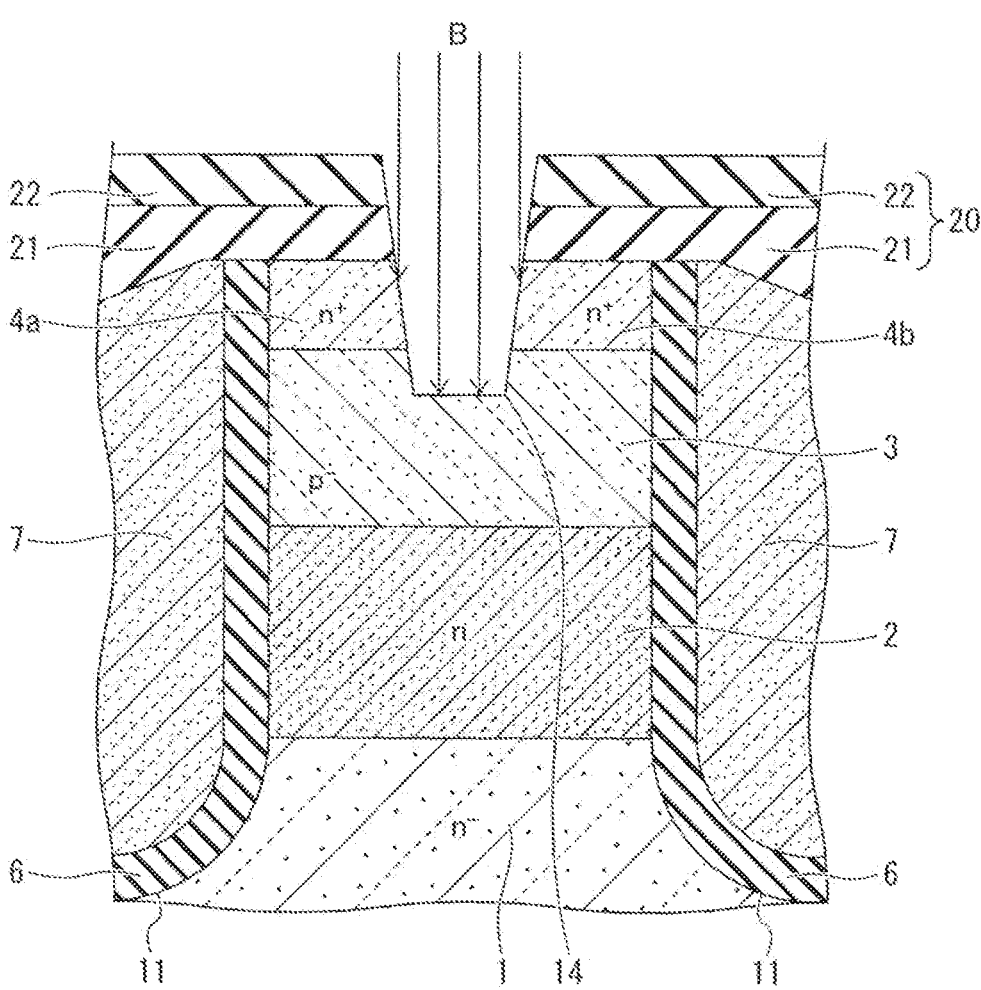
FIG. 14 is a cross-sectional process view illustrating a method of manufacturing a semiconductor device of a comparative example.

A method of manufacturing a semiconductor device of a comparative example is described below. The method of manufacturing the semiconductor device of the comparative example has the same procedure as the method of manufacturing the semiconductor device according to the first embodiment before the formation of the contact trenches 14. The method of manufacturing the semiconductor device of the comparative example includes a step of forming the contact trenches 14 having a tapered shape (a regular tapered shape) with a width gradually decreasing toward the bottom from the opening, as illustrated in FIG. 14. Next, p-type impurity ions are implanted into the bottom of the respective contact trenches 14.

Figure 15:
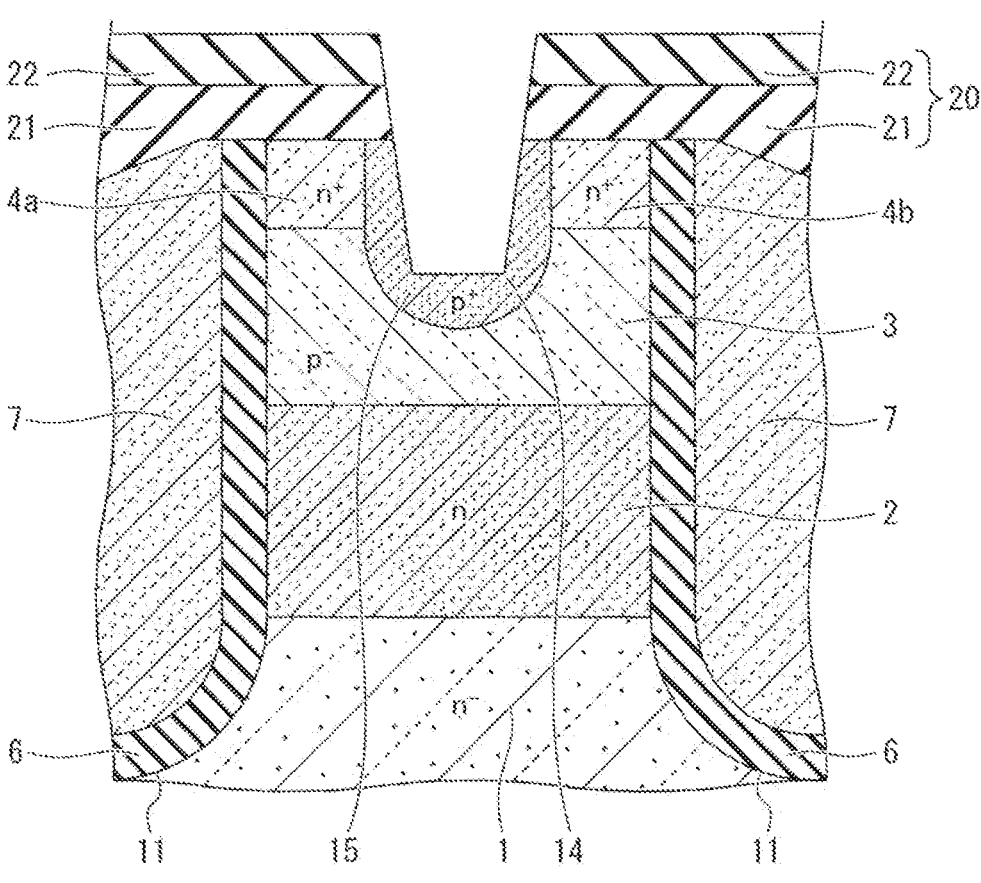
FIG. 15 is a cross-sectional process view continued from FIG. 14, illustrating the method of manufacturing the semiconductor device of the comparative example.
Figure 16:
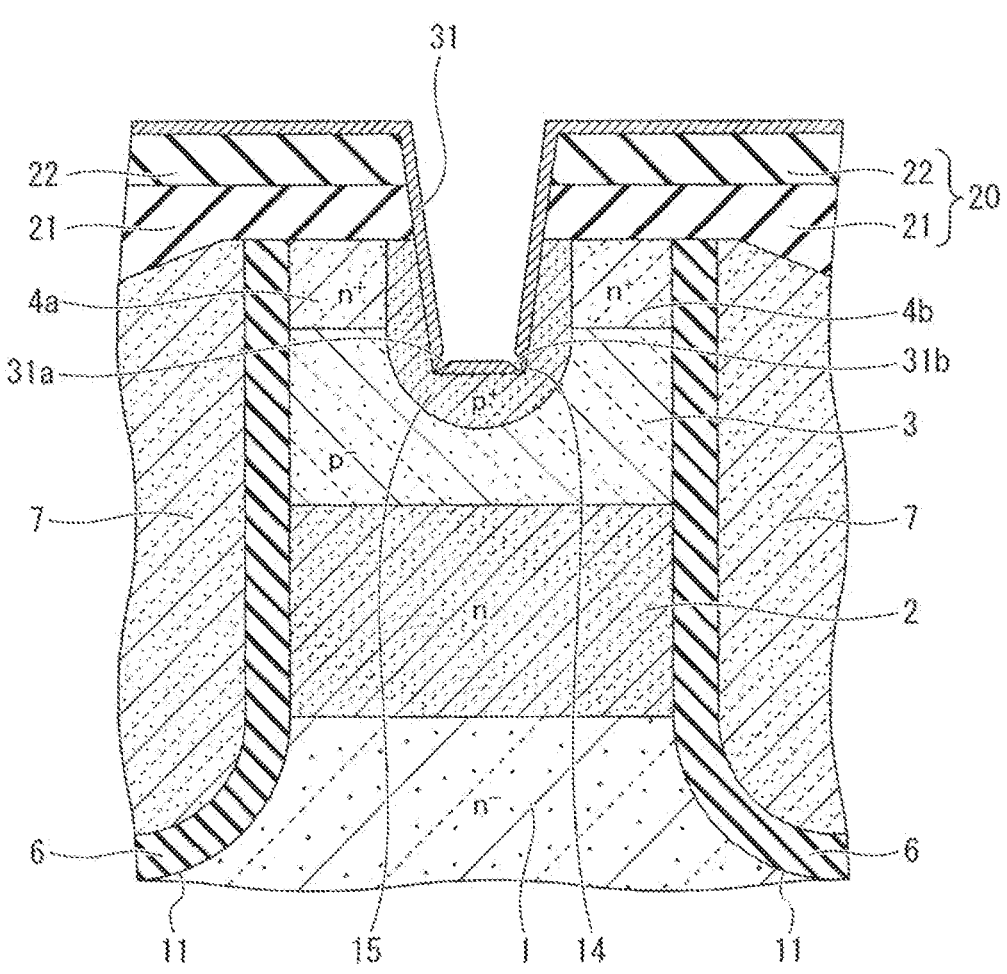
FIG. 16 is a cross-sectional process view continued from FIG. 15, illustrating the method of manufacturing the semiconductor device of the comparative example.

Subsequently, the annealing is executed so as to form the p$^+$-type contact region 15 along the bottom and the side walls of the respective contact trenches 14, as illustrated in FIG. 15. While the n-type impurity ions of the emitter regions 4a and 4b are compensated by the p-type impurity ions in the part at which the contact region 15 overlaps with the respective emitter regions 4a and 4b, the conductivity type of the n-type region is not inverted but remains the same, since the impurity concentration of the n-type impurity ions of the emitter regions 4a and 4b are sufficiently high. Next, as illustrated in FIG. 16, the barrier metal film 31 is formed in the contact trenches 14. The following steps are the same as those of the method of manufacturing the semiconductor device according to the first embodiment.

The method of manufacturing the semiconductor device of the comparative example, when intending to implant the p-type impurity ions into the bottom of the contact trenches 14, inevitably implants the p-type impurity ions further into the side wall surfaces of the contact trenches 14, since the respective contact trenches 14 have a tapered shape, as illustrated in FIG. 14. The implantation of the p-type impurity ions into the side wall surfaces of the contact trenches 14 changes a gate threshold voltage. The changed amount of the gate threshold voltage varies depending on a difference in shape of the contact trenches 14 on the plane of the wafer or between the wafers, and the variation of the gate threshold voltage is thus increased.

The method of manufacturing the semiconductor device according to the first embodiment differs from that of the comparative example in providing the contact trenches 14 such that the opening width W1 of the respective contact trenches 14 conforms to the opening width at the lower end of the respective contact holes 20a, the upper parts 14a and 14b of the side walls (14a, 14c, 14e) (14b, 14d, 14f) continuously connected to the opening of the respective contact trenches 14 have a curved surface convex to the outside, and the lower parts 14e and 14f continuously connected to the bottom 14g of the respective contact trenches 14 have a curved surface convex to the outside, as illustrated in FIG. 3. This configuration can prevent the p-type impurity ions from being implanted into the side walls (14a, 14c, 14e) (14b, 14d, 14f) on both sides of the respective contact trenches 14 when intending to implant the p-type impurity ions into the bottom 14g of the respective contact trenches 14, as illustrated in FIG. 10. The present embodiment thus can avoid a fluctuation or variation in the gate threshold voltage derived from the ion implantation toward the side walls (14a, 14c, 14e) (14b, 14d, 14f) of the respective contact trenches 14 accordingly.

Further, the method of manufacturing the semiconductor device according to the first embodiment can avoid a decrease in the contact resistance of the emitter regions 4a and 4b because the n-type impurity ions in the emitter regions 4a and 4b are not compensated by the p-type impurity ions in the contact region 15, since the contact region 15 is provided separately from the respective emitter regions 4a and 4b.

The method of manufacturing the semiconductor device of the comparative example provides the contact trenches 14 with the side walls and the bottom each having a flat surface, as illustrated in FIG. 16, so as to lead the connected parts defined by the side walls and the bottom of the respective contact trenches 14 to have an angular shape. This structure could cause cut-off parts 31a and 31b in the barrier metal film 31 at the connected parts defined by the side walls and the bottom of the respective contact trenches 14 when the barrier metal film 31 is formed, and thus could further lead to a separation of the barrier metal film 31 starting from the cut-off parts 31a and 31b.

As compared with the comparative example, the method of manufacturing the semiconductor device according to the first embodiment provides the contact trenches 14 such that the lower parts 14e and 14f continuously connected to the bottom 14g of the respective contact trenches 14 each have a curved surface convex to the outside, and the connected parts defined by the lower parts 14e and 14f and the bottom 14g of the respective contact trenches 14 are rounded having a curvature. This structure can prevent the cut-off of the barrier metal film 31, so as to avoid a separation of the barrier metal film 31 derived from the cut-off parts accordingly.

Second Embodiment

Figure 17:
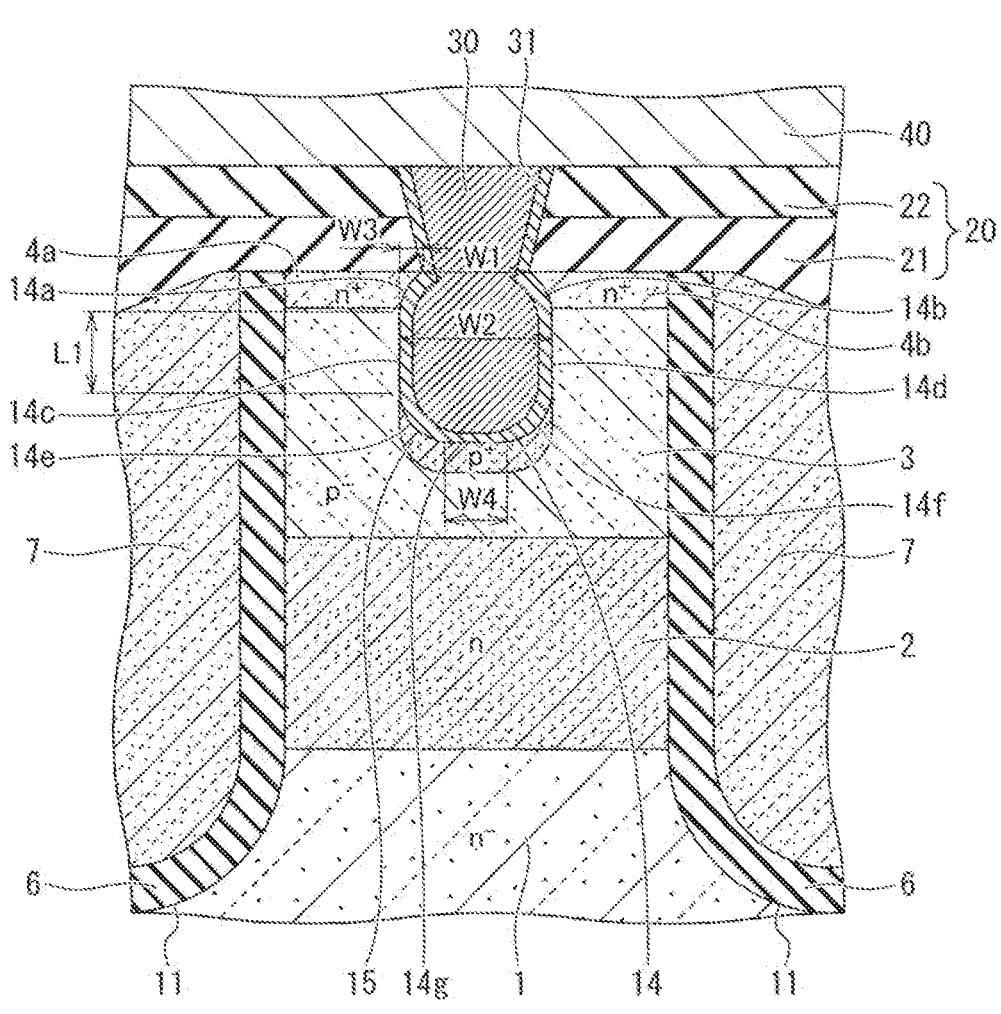
FIG. 17 is a cross-sectional view illustrating an example of a semiconductor device according to a second embodiment.

A semiconductor device according to a second embodiment differs from the semiconductor device according to the first embodiment in that the middle parts 14c and 14d of the respective contact trenches 14 having a flat surface do not elongate across the interface of the p-n junction between the emitter regions 4a and 4b and the base region 3 but are located at a position under the interface of the p-n junction between the emitter regions 4a and 4b and the base region 3, as illustrated in FIG. 17. The middle parts 14c and 14d are provided not in contact with the emitter regions 4a and 4b but only in contact with the base region 3.

The other configurations of the semiconductor device according to the second embodiment are the same as those of the semiconductor device according to the first embodiment, and overlapping explanations are not repeated below. The method of manufacturing the semiconductor device according to the second embodiment is also the same as the method of manufacturing the semiconductor device according to the first embodiment, and overlapping explanations are not repeated below.

The semiconductor device according to the second embodiment, which has the configuration in which the middle parts 14c and 14d of the respective contact trenches 14 having a flat surface are located at the position under the interface of the p-n junction between the emitter regions 4a and 4b and the base region 3, can also avoid a fluctuation or variation in the gate threshold voltage upon the ion implantation with respect to the contact trenches 14, and thus can prevent a separation of the barrier metal film 31, as in the case of the semiconductor device according to the first embodiment.

The semiconductor device according to the second embodiment has the configuration in which the middle parts 14c and 14d of the respective contact trenches 14 having a flat surface are located at the position under the interface of the p-n junction between the emitter regions 4a and 4b and the base region 3, and the upper parts 14a and 14b having a curved surface convex to the outside are in contact with the emitter regions 4a and 4b. This configuration can prevent the p-type impurity ions from being implanted into the emitter regions 4a and 4b more reliably when implanting the p-type impurity ions into the bottom of the respective contact trenches 14, avoiding a decrease in the contact resistance of the emitter regions 4a and 4b accordingly.

Third Embodiment

Figure 18:
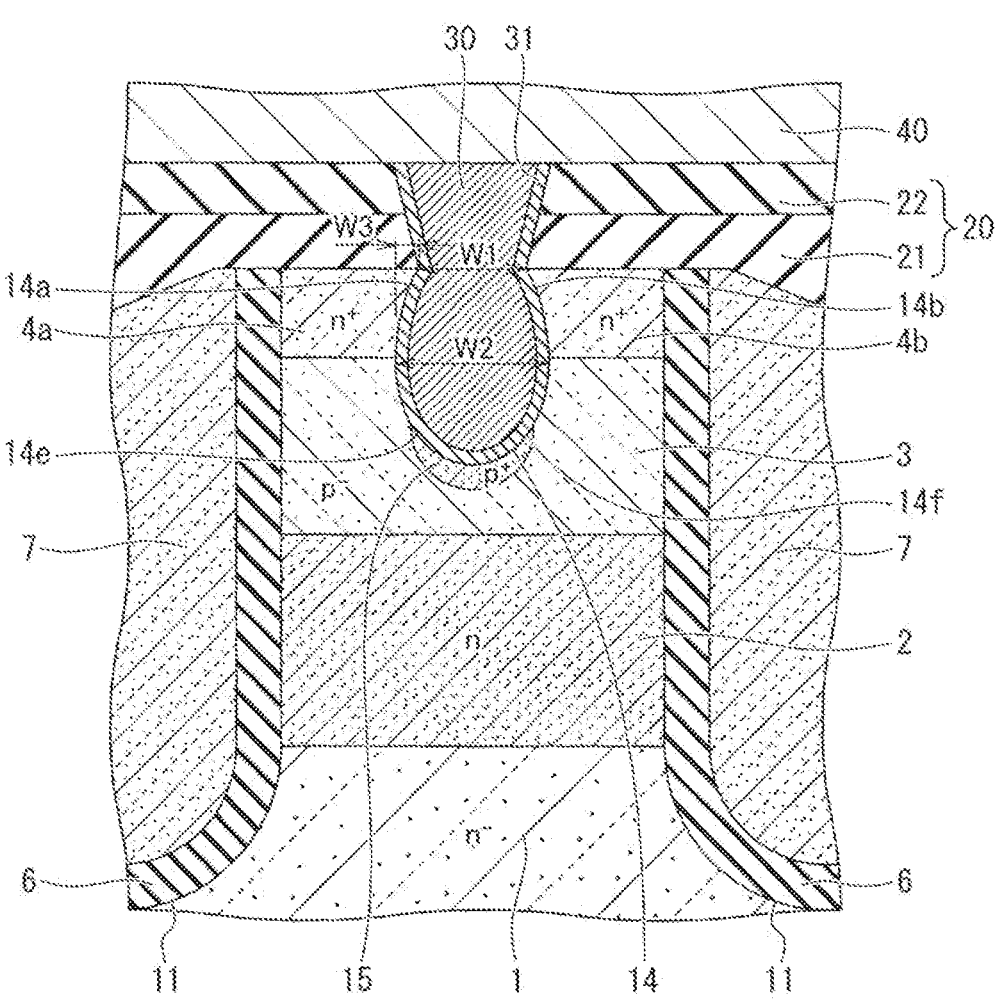
FIG. 18 is a cross-sectional view illustrating an example of a semiconductor device according to a third embodiment.

A semiconductor device according to a third embodiment differs from the semiconductor device according to the first embodiment in that the middle parts 14c and 14d of the side walls (14a. 14c, 14e) (14b. 14d, 14f) of the respective contact trenches 14 are not provided but the upper side walls 14a and 14b are connected directly to the lower side walls 14e and 14f, as illustrated in FIG. 18. The semiconductor device according to the third embodiment further differs from the semiconductor device according to the first embodiment in that the bottom 14g of the respective contact trenches 14 is not provided but the lower parts 14e and 14f are integrated together at the bottom of the respective contact trenches 14.

The respective contact trenches 14 have the maximum width W2 at the connected parts between the upper side walls 14a and 14b and the lower side walls 14e and 14f of the side walls (14a, 14e) (14b. 14f). The position having the maximum width W2 is located under the interface of the p-n junction between the base region 3 and the respective emitter regions 4a and 4b and also inside the base region 3. The position having the maximum width W2 may conform to the interface of the p-n junction between the base region 3 and the respective emitter regions 4a and 4b instead. The bottom of the respective contact trenches 14 is deeper as being closer to the middle part and deepest at the middle part.

The other configurations of the semiconductor device according to the third embodiment are the same as those of the semiconductor device according to the first embodiment, and overlapping explanations are not repeated below. The method of manufacturing the semiconductor device according to the third embodiment is also the same as the method of manufacturing the semiconductor device according to the first embodiment, and overlapping explanations are not repeated below. The contact trenches 14 may be formed as follows. First, a first trench part is formed on the top surface of the mesa part by anisotropic etching or isotropic etching, for example. Next, a passivation film such as a nitride film is formed on the side wall of the first trench part. Subsequently, the bottom of the first trench part is subjected to etching so as to form a second trench part continued from the first trench part and having a greater width than the first trench part, and further form a passivation film on the side wall of the second trench part. The steps of forming the trench parts and forming the passivation films are then repeated so as to form a plurality of trench parts having gradually-increasing widths. Thereafter, the passivation films in the respective trench parts are removed, and the isotropic etching is then executed so as to form the respective contact trenches 14.

The semiconductor device according to the third embodiment, which has the structure in which the entire side walls (14a, 14e) (14b, 14f) of the respective contact trenches 14 have a curved surface, can also avoid a fluctuation or variation in the gate threshold voltage upon the ion implantation with respect to the contact trenches 14, and thus can prevent a separation of the barrier metal film 31, as in the case of the semiconductor device according to the first embodiment.

The semiconductor device according to the third embodiment has a small curvature at the connected portions between the lower parts 14e and 14f of the respective contact trenches 14 since the bottom of the respective contact trenches 14 is curved, as compared with the case of being provided with the flat (leveled) bottom 14g, so as to prevent the separation of the barrier metal film 31 more reliably.

The semiconductor device according to the third embodiment also has the configuration in which the position having the maximum width W2 in the respective contact trenches 14 conforms to the interface of the p-n junction between the base region 3 and the respective emitter regions 4a and 4b or is located under the interface of the p-n junction between the base region 3 and the respective emitter regions 4a and 4b, and the upper parts 14a and 14b of the respective contact trenches 14 having a curved surface convex to the outside are in contact with the emitter regions 4a and 4b. This configuration can prevent the p-type impurity ions from being implanted into the emitter regions 4a and 4b more reliably when implanting the p-type impurity ions into the bottom of the respective contact trenches 14, avoiding a decrease in the contact resistance of the emitter regions 4a and 4b accordingly.

Fourth Embodiment

Figure 19:
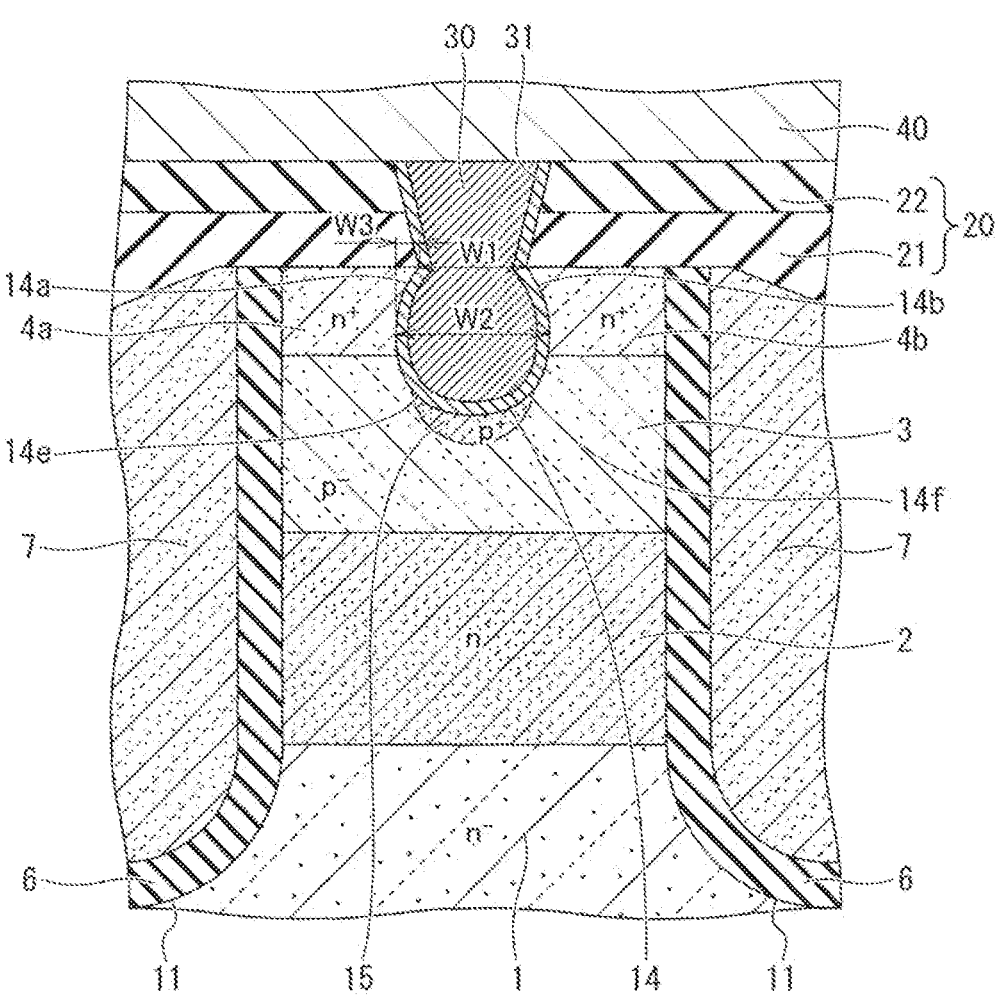
FIG. 19 is a cross-sectional view illustrating an example of a semiconductor device according to a fourth embodiment.

A semiconductor device according to a fourth embodiment has a configuration common to that of the semiconductor device according to the third embodiment in that the entire side walls (14a, 14c, 14e) (14b, 14d, 14f) of the respective contact trenches 14 have a curved surface, as illustrated in FIG. 19. The semiconductor device according to the fourth embodiment differs from the semiconductor device according to the third embodiment in that the position having the maximum width W2 corresponding to the connected parts between the upper side walls 14a and 14b and the lower side walls 14e and 14f of the side walls (14a. 14e)

(14b, 14f) is located above the interface of the p-n junction between the base region 3 and the respective emitter regions 4a and 4b and also inside the emitter regions 4a and 4b.

The other configurations of the semiconductor device according to the fourth embodiment are the same as those of the semiconductor device according to the third embodiment, and overlapping explanations are not repeated below. The method of manufacturing the semiconductor device according to the fourth embodiment is also the same as the method of manufacturing the semiconductor device according to the third embodiment, and overlapping explanations are not repeated below.

The semiconductor device according to the fourth embodiment, which has the structure in which the entire side walls (14a, 14e) (14b, 14f) of the respective contact trenches 14 have a curved surface, can also avoid a fluctuation or variation in the gate threshold voltage upon the ion implantation with respect to the contact trenches 14, and thus can prevent a separation of the barrier metal film 31, as in the case of the semiconductor device according to the first embodiment.

The semiconductor device according to the fourth embodiment has a small curvature at the connected portions between the lower parts 14e and 14f of the respective contact trenches 14 since the bottom of the respective contact trenches 14 is curved, as compared with the case of being provided with the flat (leveled) bottom 14g, so as to prevent the separation of the barrier metal film 31 more reliably.

Fifth Embodiment

Figure 20:
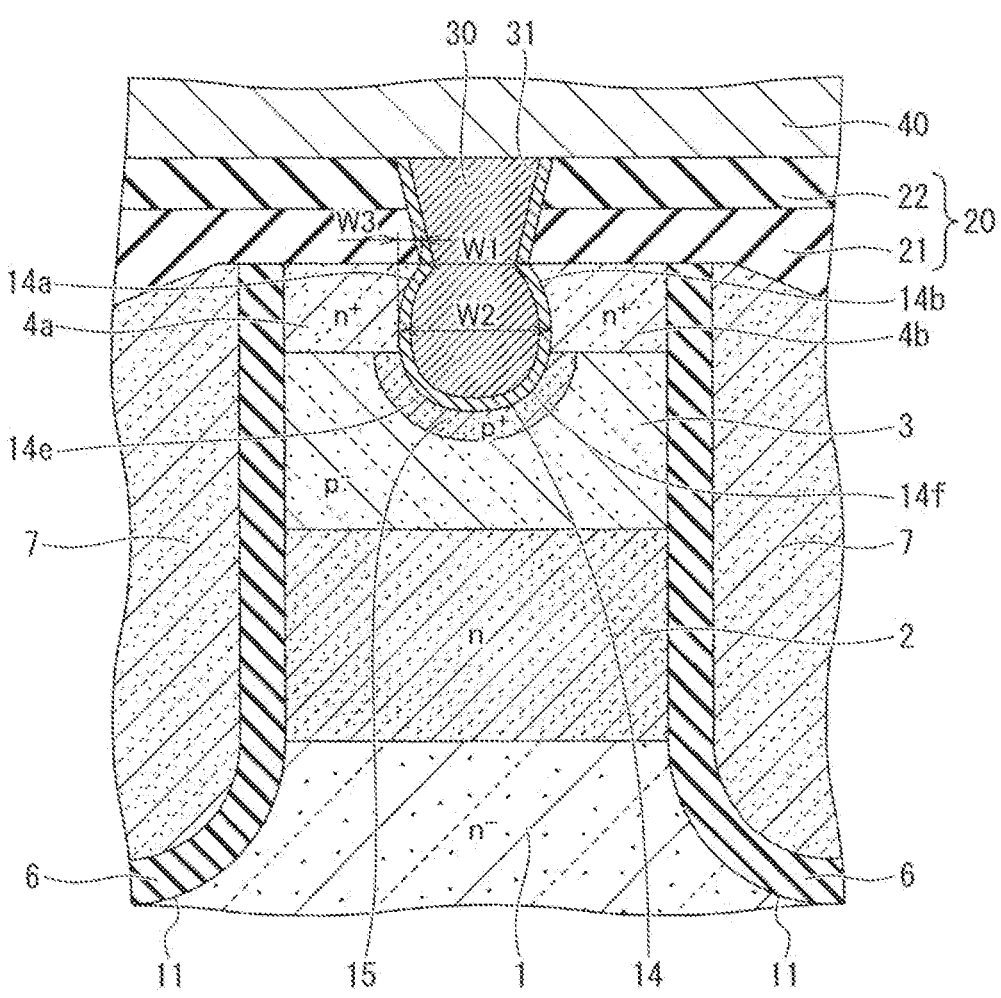
FIG. 20 is a cross-sectional view illustrating an example of a semiconductor device according to a fifth embodiment.

A semiconductor device according to a fifth embodiment has a configuration common to that of the semiconductor device according to the fourth embodiment in that the entire side walls (14a, 14c, 14e) (14b, 14d, 14f) of the respective contact trenches 14 have a curved surface, and in that the position having the maximum width W2 of the side walls (14a, 14e) (14b, 14f) of the respective contact trenches 14 is located above the interface of the p-n junction between the base region 3 and the respective emitter regions 4a and 4b, as illustrated in FIG. 20. The semiconductor device according to the fifth embodiment differs from the semiconductor device according to the fourth embodiment in that the contact region 15 is in contact with the respective emitter regions 4a and 4b.

The other configurations of the semiconductor device according to the fifth embodiment are the same as those of the semiconductor device according to the fourth embodiment, and overlapping explanations are not repeated below. The method of manufacturing the semiconductor device according to the fifth embodiment is also the same as the method of manufacturing the semiconductor device according to the fourth embodiment, and overlapping explanations are not repeated below.

The semiconductor device according to the fifth embodiment, which has the structure in which the entire side walls (14a, 14e) (14b, 14f) of the respective contact trenches 14 have a curved surface, can also avoid a fluctuation or variation in the gate threshold voltage upon the ion implantation with respect to the contact trenches 14, and thus can prevent a separation of the barrier metal film 31, as in the case of the semiconductor device according to the first embodiment.

The semiconductor device according to the fifth embodiment has a small curvature at the connected portions between the lower parts 14e and 14f of the respective contact trenches 14 since the bottom of the respective contact trenches 14 is curved, as compared with the case of being provided with the flat (leveled) bottom 14g, so as to prevent the separation of the barrier metal film 31 more reliably.

Other Embodiments

As described above, the invention has been described according to the first to fifth embodiments, but it should not be understood that the description and drawings implementing a portion of this disclosure limit the invention. Various alternative embodiments of the present invention, examples, and operational techniques will be apparent to those skilled in the art from this disclosure.

While the semiconductor devices according to the first to fifth embodiments have been illustrated with the RC-IGBT, the present invention can also be applied to any other IGBTs other than the RC-IGBT. For example, the present invention may be applied to a reverse-blocking insulated gate bipolar transistor (RB-IGBT) or a simple IGBT. The present invention may also be applied to a MOSFET having a configuration in which a drain region of $n^+$-type is used instead of the $p^+$-type collector region 9 that is the IGBT in the transistor part 101 illustrated in FIG. 2.

While the semiconductor devices according to the first to fifth embodiments have been illustrated with the trench-gate semiconductor device having the insulated gate electrode structure (6, 7) buried in the respective gate trenches 11, the present invention can also be applied to a planar-gate semiconductor device having an insulated gate electrode structure on the top surface of a semiconductor substrate.

Further, the configurations disclosed in the first to fifth embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present specification.

What is claimed is:

1. A semiconductor device comprising:
an insulated gate electrode structure provided in a semiconductor substrate of a first conductivity-type;
a base region of a second conductivity-type provided in contact with the insulated gate electrode structure at an upper part of the semiconductor substrate;
a first main electrode region of the first conductivity-type provided in contact with the insulated gate electrode structure at an upper part of the base region;
a contact plug buried in a trench penetrating the first main electrode region to reach the base region with a barrier metal film interposed;
an interlayer insulating film deposited on a top surface of the semiconductor substrate and provided with a contact hole integrally connected to the trench;
a contact region of the second conductivity-type provided in contact with a bottom of the trench; and
a second main electrode region deposited on a bottom surface side of the semiconductor substrate,
wherein an opening width at a lower end of the contact hole conforms to a width at an opening of the trench, an upper part of a side wall continued from the opening of the trench has a curved surface convex to an outside, and a lower part of the side wall continuously connected to the bottom of the trench has a curved surface convex to the outside.

2. The semiconductor device of claim 1, wherein a middle part continuously connected to the upper part and the lower part of the side wall has a flat surface.

3. The semiconductor device of claim 2, wherein the middle part corresponds to a position having a maximum width in the trench.

4. The semiconductor device of claim 2, wherein the middle part is located across an interface between the first main electrode region and the base region.

5. The semiconductor device of claim 2, wherein the middle part is located under an interface between the first main electrode region and the base region.

6. The semiconductor device of claim 1, wherein the trench has a maximum width at an interface between the upper part and the lower part of the side wall continuously connected to each other.

7. The semiconductor device of claim 6, wherein a depth at which the trench has the maximum width is located at a position conforming to an interface between the first main electrode region and the base region or located at a position under the interface.

8. The semiconductor device of claim 6, wherein a depth at which the trench has the maximum width is located at a position above an interface between the first main electrode region and the base region.

9. The semiconductor device of claim 1, wherein a protruding width of the first main electrode region at a position corresponding to the opening is in a range of 3 nanometers or greater and 30 nanometers or smaller.

10. The semiconductor device of claim 1, wherein the bottom of the trench has a flat surface.

11. The semiconductor device of claim 1, wherein the bottom of the trench has a curved surface having a deepest width in a middle part.

12. The semiconductor device of claim 1, wherein the contact region is located separately from the first main electrode region.

13. The semiconductor device of claim 1, wherein the trench extends in a stripe-shaped state in a plan view.

14. The semiconductor device of claim 1, wherein the insulated gate electrode structure is buried in another trench different from the trench.

15. A method of manufacturing a semiconductor device, comprising:

forming an insulated gate electrode structure in a semiconductor substrate of a first conductivity-type;

forming a base region of a second conductivity-type so as to be in contact with the insulated gate electrode structure at an upper part of the semiconductor substrate;

forming a first main electrode region of the first conductivity-type so as to be in contact with the insulated gate electrode structure at an upper part of the base region;

forming an interlayer insulating film on a top surface of the semiconductor substrate;

opening a contact hole in the interlayer insulating film;

forming a trench at the upper part of the semiconductor substrate so as to be integrally connected to the contact hole and penetrating the first main electrode region to reach the base region;

forming a contact region of the second conductivity-type so as to be in contact with a bottom of the trench by implanting impurity ions of the second conductivity-type into the bottom of the trench;

burying a contact plug in the trench with a barrier metal film interposed; and forming a second main electrode region on a bottom surface side of the semiconductor substrate, the forming the trench is executed so as to have a structure in which an opening width at a lower end of the contact hole conforms to a width at an opening of the trench, an upper part of a side wall continued from the opening of the trench has a curved surface convex to an outside, and a lower part of the side wall continuously connected to the bottom of the trench has a curved surface convex to the outside.

\* \* \* \* \*